(12) United States Patent
Ohta et al.

(10) Patent No.: US 11,495,689 B2
(45) Date of Patent: Nov. 8, 2022

(54) THIN-FILM TRANSISTOR AND METHOD FOR PRODUCING SAME

(71) Applicant: SAKAI DISPLAY PRODUCTS CORPORATION, Sakai (JP)

(72) Inventors: Hiroyuki Ohta, Sakai (JP); Tomohiro Inoue, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 150 days.

(21) Appl. No.: 17/265,746

(22) PCT Filed: Aug. 8, 2018

(86) PCT No.: PCT/JP2018/029844
§ 371 (c)(1),
(2) Date: Feb. 3, 2021

(87) PCT Pub. No.: WO2020/031309
PCT Pub. Date: Feb. 13, 2020

(65) Prior Publication Data
US 2021/0296505 A1    Sep. 23, 2021

(51) Int. Cl.
*H01L 29/786* (2006.01)
*H01L 29/66* (2006.01)

(52) U.S. Cl.
CPC .... *H01L 29/78618* (2013.01); *H01L 29/6675* (2013.01); *H01L 29/78663* (2013.01); *H01L 29/78672* (2013.01)

(58) Field of Classification Search
CPC ........... H01L 29/78618; H01L 29/6675; H01L 29/78663; H01L 29/78672; H01L 29/45;
(Continued)

(56) References Cited

U.S. PATENT DOCUMENTS

| 5,528,055 A | 6/1996 | Komori et al. |
| 2012/0220140 A1 | 8/2012 | Kajiyama et al. |

(Continued)

FOREIGN PATENT DOCUMENTS

| JP | H01-309378 A | 12/1989 |
| JP | H03-222370 A | 10/1991 |

(Continued)

*Primary Examiner* — Edward Chin
(74) *Attorney, Agent, or Firm* — ScienBiziP, P.C.

(57) ABSTRACT

A thin film transistor 101 includes: a gate electrode 2, a semiconductor layer 4 disposed on the gate electrode via a gate insulating layer 3, a source electrode 8s disposed on a portion of the semiconductor layer 4 via a first contact layer Cs, and a drain electrode 8d disposed on another portion via a second contact layer Cd. The first and second contact layers have a multilayer structure including N (where N is an integer equal to or greater than 1) two-layer structures S(n) (where n is an integer not smaller than 1 and not greater than N), each two-layer structure S(n) including a first amorphous silicon layer 71 that is directly in contact with the source or drain electrode, a second amorphous silicon layer 72(n), and a third amorphous silicon layer 73(n) that is directly in contact with an upper face thereof. In each two-layer structure S(n), n type impurity concentrations $C2(n)$ and $C3(n)$ of the second amorphous silicon layer and the third amorphous silicon layer and an n type impurity concentration $C1$ of the first amorphous silicon layer satisfy $C2(n)<C3(n)<C1$ for any given n.

20 Claims, 10 Drawing Sheets

(58) Field of Classification Search
CPC ............. H01L 29/66742; H01L 29/458; H01L 29/786
See application file for complete search history.

(56) References Cited

U.S. PATENT DOCUMENTS

2017/0162707 A1* 6/2017 Lv ..................... H01L 29/78621
2018/0097120 A1 4/2018 Ishida et al.
2018/0122839 A1 5/2018 Nodera et al.

FOREIGN PATENT DOCUMENTS

| JP | H06-151856 A | 5/1994 |
|----|---|---|
| JP | 6275294 B2 | 2/2018 |
| WO | 2011/055618 A1 | 5/2011 |
| WO | 2011/132559 A1 | 10/2011 |
| WO | 2016/157351 A1 | 10/2016 |
| WO | 2016/170571 A1 | 10/2016 |

* cited by examiner (a)

(b)

(c)

(d)

(e)

(f)

THIN-FILM TRANSISTOR AND METHOD FOR PRODUCING SAME

TECHNICAL FIELD

The present invention relates to a thin film transistor and a method of producing the same.

BACKGROUND ART

Thin film transistors (hereinafter, "TFT") are used as switching elements on an active matrix substrate of a display apparatus such as a liquid crystal display apparatus or an organic EL display apparatus, for example. In the present specification, such TFTs will be referred to as "pixel TFTs". As pixel TFTs, amorphous silicon TFTs whose active layer is an amorphous silicon film (hereinafter abbreviated as an "a-Si film"), and polycrystalline silicon TFTs whose active layer is a polycrystalline silicon (polysilicon) film (hereinafter abbreviated as a "poly-Si film") have been widely used. Generally speaking, a poly-Si film has a higher field-effect mobility than that of an a-Si film, and therefore a polycrystalline silicon TFT has a higher current driving power (i.e., a larger ON current) than that of an amorphous silicon TFT.

A TFT having a gate electrode disposed at the substrate side of the active layer is referred to as a "bottom-gate type TFT", whereas a TFT having a gate electrode disposed above its active layer (i.e., the opposite side from the substrate) is referred to as a "top-gate type TFT". In some cases, forming bottom-gate type TFTs as the pixel TFTs may have cost advantages relative to forming top-gate type TFTs. Polycrystalline silicon TFTs are usually of top-gate type, but polycrystalline silicon TFTs of bottom-gate type have also been proposed.

Known types of bottom-gate type TFTs are channel-etch type TFTs (hereinafter "CE-type TFT") and etch-stop type TFTs (hereinafter "ES-type TFT"). In a CE-type TFT, an electrically conductive film is formed directly upon an active layer, and this electrically conductive film is patterned to provide a source electrode and a drain electrode (source-drain separation). On the other hand, in an ES-type TFT, a source-drain separation step is performed while a channel section of the active layer is covered with an insulating layer that functions as an etchstop (hereinafter referred to as a "protective insulating layer").

For example, Patent Documents 1 and 2 disclose bottom-gate type (ES type) TFTs whose active layer is a polycrystalline (or amorphous) silicon layer. In these documents, a semiconductor layer containing an impurity is provided between the active layer and each of the source and drain electrodes of the TFT. In the present specification, a low-resistance semiconductor layer that connects an electrode and the active layer is referred to as a "contact layer".

CITATION LIST

Patent Literature

[Patent Document 1] Japanese Laid-Open Patent Publication No. 6-151856
[Patent Document 2] International Publication No. 2016/157351

SUMMARY OF INVENTION

Technical Problem

The pixel TFTs of an active matrix substrate are required to improve in terms of not only ON characteristics, but also OFF characteristics.

However, in conventional TFTs, in a region where the gate electrode and the drain electrode overlap, a leak current may occur from a high electric field between the gate and the drain owing to a quantum mechanical tunneling effect (gate-induced drain leakage (GIDL)), thus resulting in a large OFF-leak current. The details will be described later. When there is a large OFF-leak current, displaying characteristics may deteriorate, e.g., display unevennesses occurring when the display panel is activated.

Embodiments of the present invention have been made in view of the above circumstances, and an objective thereof is to provide a thin film transistor which allows for reduction of an OFF-leak current, and a method of producing the same.

Solution to Problem

A thin film transistor according to an embodiment of the present invention comprises: a substrate; a gate electrode supported by the substrate; a gate insulating layer covering the gate electrode; a semiconductor layer disposed on the gate insulating layer, the semiconductor layer including a first region, a second region, and a channel region that is located between the first region and the second region; a first contact layer disposed above the first region of the semiconductor layer; a second contact layer disposed above the second region of the semiconductor layer; a source electrode disposed on the first contact layer, the source electrode being electrically connected to the first region via the first contact layer; and a drain electrode disposed on the second contact layer, the drain electrode being electrically connected to the second region via the second contact layer, wherein, the first and second contact layers each have a multilayer structure including a first amorphous silicon layer that is directly in contact with the source electrode or the drain electrode; the multilayer structure includes N (where N is an integer equal to or greater than 1) two-layer structures $S(n)$ (where n is an integer not smaller than 1 and not greater than N), each two-layer structure $S(n)$ comprising a second amorphous silicon layer and a third amorphous silicon layer that is directly in contact with an upper face of the second amorphous silicon layer; and the relationship $C2(n)<C3(n)<C1$ is satisfied for any given n, where $C2(n)$ is a concentration of an n type impurity contained in the second amorphous silicon layer of each of the two-layer structures $S(n)$; $C3(n)$ is a concentration of an n type impurity contained in the third amorphous silicon layer; and C1 is a concentration of an n type impurity contained in the first amorphous silicon layer.

In one embodiment, N may be 3 or more.
In one embodiment, N may be 5 or more.
In one embodiment, the second amorphous silicon layer and the third amorphous silicon layer in the two-layer structure $S(n)$ may respectively have a thickness of 20 nm or less.
In one embodiment, an electrical resistivity $\rho 1$ of the first amorphous silicon layer may be 300 $\Omega \cdot cm$ or less; an electrical resistivity $\rho 2$ of the second amorphous silicon layer may be $1 \times 10^5$ $\Omega \cdot cm$ or more; and an electrical resistivity $\rho 3$ of the third amorphous silicon layer may be not less than 500 $\Omega \cdot cm$ but less than 90000 $\Omega \cdot cm$.
In one embodiment, the concentration C1 may be not less than $5 \times 10^{19}$ atoms/cm$^3$ and not more than $1 \times 10^{23}$ atoms/cm$^3$.
In one embodiment, the concentration $C3(n)$ may be not less than $1.2 \times 10^{17}$ atoms/cm$^3$ and not more than $4 \times 10^{19}$ atoms/cm$^3$; and the concentration $C2(n)$ may be not less than 0 and not more than $1 \times 10^{17}$ atoms/cm$^3$.

In one embodiment, the multilayer structure further includes a fourth amorphous silicon layer that is directly in contact with the first region or the second region of the semiconductor layer; and the relationship $C2(n)<C4$ is satisfied for any given n, where C4 is a concentration of an n type impurity contained in the fourth amorphous silicon layer.

In one embodiment, the semiconductor layer includes a polysilicon region, the polysilicon region including the first region, the second region, and the channel region; and the concentration C4 of the n type impurity contained in the fourth amorphous silicon layer satisfies the relationship $C3(n)<C4$ for any given n.

In one embodiment, the concentration C4 may be not less than $5\times10^{19}$ atoms/cm$^3$ and not more than $1\times10^{23}$ atoms/cm$^3$.

In one embodiment, when viewed from a normal direction of the substrate, the semiconductor layer further includes an amorphous silicon region located outside the polysilicon region.

A thin film transistor according to another embodiment of the present invention comprises: a substrate; a gate electrode supported by the substrate; a gate insulating layer covering the gate electrode; a semiconductor layer disposed on the gate insulating layer, the semiconductor layer including a first region, a second region, and a channel region that is located between the first region and the second region; a first contact layer disposed above the first region of the semiconductor layer; a second contact layer disposed above the second region of the semiconductor layer; a source electrode disposed on the first contact layer, the source electrode being electrically connected to the first region via the first contact layer; and a drain electrode disposed on the second contact layer, the drain electrode being electrically connected to the second region via the second contact layer, wherein, the first contact layer and the second contact layer are each an amorphous silicon layer containing an n type impurity; the amorphous silicon layer includes a contact region which is in contact with the source electrode or the drain electrode and in which the concentration of the n type impurity is R1 or more, and a concentration-modulated region which is located between the contact region and the semiconductor layer and in which a concentration profile of the n type impurity varies along a depth direction from the source electrode or the drain electrode toward the semiconductor layer; the concentration-modulated region includes two or more first gradient regions including a portion where the concentration along the depth direction decreases from R3 to R2 within a range of 20 nm and two or more second gradient regions including a portion where the concentration along the depth direction increases from R2 to R3 within a range of 20 nm, the first gradient regions and the second gradient regions alternating with each other; and the concentrations R1, R2 and R3 satisfy the relationship $R2<R3<R1$.

In one embodiment, in the first gradient region, the concentration decreases by two orders of magnitude or more.

In one embodiment, the concentration R1 may be $4.5\times10^{19}$ atoms/cm$^3$, the concentration R2 may be $1.5\times10^{17}$ atoms/cm$^3$, and the concentration R3 may be $4.5\times10^{17}$ atoms/cm$^3$.

A thin film transistor according to still another embodiment of the present invention comprises: a substrate; a gate electrode supported by the substrate; a gate insulating layer covering the gate electrode; a semiconductor layer disposed on the gate insulating layer, the semiconductor layer including a first region, a second region, and a channel region that is located between the first region and the second region; a first contact layer disposed above the first region of the semiconductor layer, the first contact layer containing an n type impurity; a second contact layer disposed above the second region of the semiconductor layer, the second contact layer containing an n type impurity, a source electrode disposed on the first contact layer, the source electrode being electrically connected to the first region via the first contact layer; and a drain electrode disposed on the second contact layer, the drain electrode being electrically connected to the second region via the second contact layer, wherein, the first and second contact layers each have a multilayer structure including a first amorphous silicon layer that is directly in contact with the source electrode or the drain electrode; the multilayer structure includes N (where N is an integer equal to or greater than 1) two-layer structures S(n) (where n is an integer not smaller than 1 and not greater than N), each comprising a second amorphous silicon layer and a third amorphous silicon layer that is directly in contact with an upper face of the second amorphous silicon layer; and the relationship $\rho2(n)>\rho3(n)>\rho1$ is satisfied for any given n, where $\rho2(n)$ is an electrical resistivity of the second amorphous silicon layer of each of the two-layer structures S(n); $\rho3(n)$ is an electrical resistivity of the third amorphous silicon layer; and $\rho1$ is an electrical resistivity of the first amorphous silicon layer.

In one embodiment, the electrical resistivity $\rho1$ may be 300 $\Omega\cdot$cm or less, the electrical resistivity $\rho2$ may be $1\times10^5$ $\Omega\cdot$cm or more, and the electrical resistivity $\rho3$ may be not less than 500 $\Omega\cdot$cm but less than 90000 $\Omega\cdot$cm.

In one embodiment, the thin film transistor of any of the above is of an etchstop type; the thin film transistor further comprises a protective insulating layer covering the channel region of the semiconductor layer, wherein a portion of the protective insulating layer is located between the semiconductor layer and the first contact layer and another portion is located between the semiconductor layer and the second contact layer.

In one embodiment, the thin film transistor of any of the above is of a channel-etch type; the thin film transistor further comprises an upper insulating layer covering the semiconductor layer, the source electrode, and the drain electrode of the thin film transistor; and the upper insulating layer is directly in contact with the channel region of the semiconductor layer.

A display apparatus according to an embodiment of the present invention comprises: the thin film transistor of any of the above; and a displaying region including a plurality of pixels, wherein a thin film transistor is disposed in each of the plurality of pixels.

A method of producing a thin film transistor according to an embodiment of the present invention is a method of producing of the above thin film transistor, comprising: step (A) of forming the gate electrode, the gate insulating layer, and the semiconductor layer on the substrate; step (B) of forming on the semiconductor layer a multilayer film including the N (where N is an integer equal to or greater than 1) two-layer structures S(n) (where n is an integer not smaller than 1 and not greater than N), wherein step (B) comprises: step (B1) of forming the N two-layer structures S(n), wherein each of the two-layer structures S(n) is formed by depositing, in this order, a second amorphous silicon film containing an n type impurity at the concentration C2(n) and a third amorphous silicon film being directly in contact with the upper face of the second amorphous silicon film and containing an n type impurity at the concentration C3(n); and step (B2) of, after step (B1), forming a first amorphous silicon film containing an n type impurity at the concentration C1; step (C) of forming, on the multilayer film, an electrically conductive film so as to be directly in contact with the first amorphous silicon film; and step (D) of patterning the electrically conductive film and the multilayer film to form the source electrode and the drain electrode from the electrically conductive film, and to form the first contact layer and the second contact layer from the multilayer film.

In one embodiment, the semiconductor layer includes a polysilicon region; step (B) further comprises, before step (B1), a step of forming a fourth amorphous silicon film so as to be in contact with the polysilicon region; and the concentration C4 of the n type impurity contained in the fourth amorphous silicon film satisfies the relationship C3(n)<C4 for any given n.

A method of producing a thin film transistor according to another embodiment of the present invention is a method of producing of the above thin film transistor, comprising: step (A) of forming the gate electrode, the gate insulating layer, and the semiconductor layer on the substrate; step (B) of forming, on the semiconductor layer, an amorphous silicon film that includes the concentration-modulated region and the contact region by a CVD technique using an impurity-containing gas containing the n type impurity and a material gas, comprising, while changing a ratio of the impurity-containing gas to the material gas, controlling a concentration of the n type impurity along the depth direction to consecutively form the amorphous silicon film; step (C) of forming an electrically conductive film on the amorphous silicon film; and step (D) of patterning the electrically conductive film and the amorphous silicon film to form the source electrode and the drain electrode from the electrically conductive film, and to form the first contact layer and the second contact layer from the amorphous silicon film.

Advantageous Effects of Invention

According to an embodiment of the present invention, there is provided a thin film transistor which allows for reduction of an OFF-leak current, and a method of producing the same.

DESCRIPTION OF EMBODIMENTS

<Finding I by the Inventors: Regarding Depletion Layers>

Conventional bottom-gate type TFTs may suffer from high GIDL. For example, in the TFT disclosed in Patent Document 1, on an active layer, source/drain electrodes are provided via a semiconductor layer containing an impurity (contact layer). In Patent Document 2, on an active layer, source/drain electrodes are provided with an intrinsic amorphous silicon layer and an $n^+$ type amorphous silicon layer interposed therebetween. According to a study by the inventors, in such conventional configurations, depletion layers (depletion layer barriers) with a sufficient thickness may not be formed, in which case the GIDL may increase.

Thus, the inventors have found a contact layer structure that allows to increase the thickness of a depletion layer (or, in the case where there are multiple depletion layers, a total thickness thereof) formed between the active layer and the source/drain electrodes, thus arriving at the present invention.

<Finding II by the Inventors: Regarding a Two-Dimensional Electron Gas>

On the other hand, the inventors have found that, in a polycrystalline silicon TFT whose active layer is a polysilicon (poly-Si) layer, forming a contact layer having an intrinsic amorphous silicon (an i type a-Si layer) as a lowermost layer on the poly-Si layer allows a heterojunction to be formed by the poly-Si layer and the i type a-Si layer, whereby a two-dimensional electron gas (hereinafter "2DEG") may be generated as in the case of a high-electron mobility transistor (HEMT). When a 2DEG is generated at an interface between a poly-Si layer and a contact layer (i.e., when electrons accumulate at this interface), the GIDL may further increase.

2DEG refers to, when a junction is formed between two kinds of semiconductors of different band gap energies, a layer of electrons (i.e., a two-dimensional distribution of electrons) that is created at that interface (in a region which is about 10 nm thick near the interface). 2DEG is known to be composed of a compound semiconductor that may be GaAs-based, InP-based, GaN-based, SiGe-based, etc. However, it has not been known that 2DEG can ever occur at a junction interface between a poly-Si layer and any other semiconductor layer (e.g., an intrinsic amorphous silicon layer (hereinafter "i type a-Si layer")) having a band gap energy larger than that of poly-Si.

In the present specification, a junction between two semiconductor layers of different band gap energies (e.g., a junction between an i type a-Si layer and a poly-Si layer) is referred to a "semiconductor heterojunction", and a junction between two semiconductor layers of similar band gap energies (e.g., a junction between an i type a-Si layer and an $n^+$ type a-Si layer) is referred to as a "semiconductor homojunction".

Figure 11:
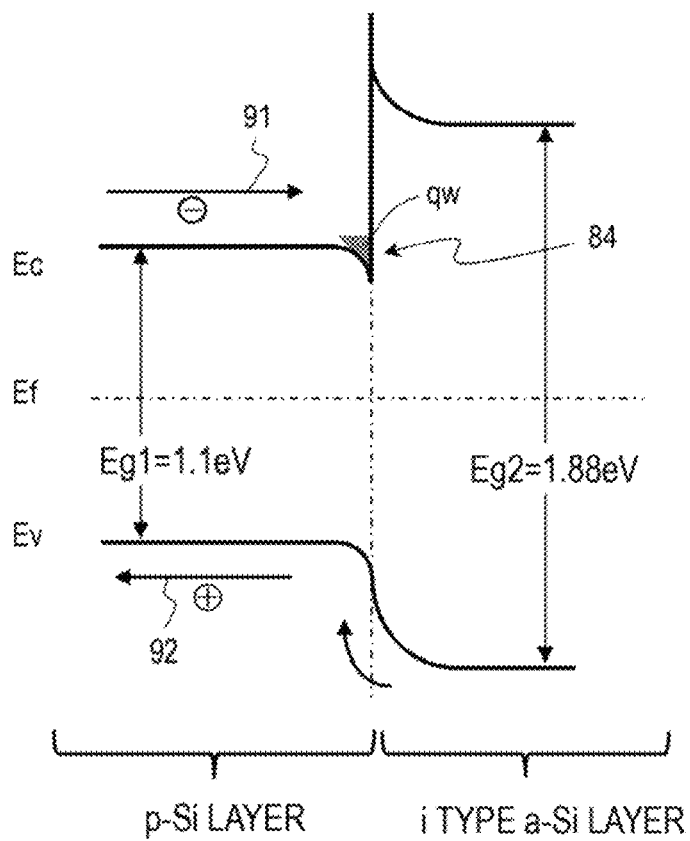
FIG. 11 A diagram showing an energy band structure near a junction interface between an i type a-Si layer and a poly-Si layer.

FIG. 11 is a schematic diagram for describing an example of an energy band structure near the interface of a semiconductor heterojunction. This illustrates a semiconductor heterojunction that is created, in a polycrystalline silicon TFT of bottom-gate type, by disposing an i type a-Si layer on a non-doped poly-Si layer (active layer).

The poly-Si layer has a band gap energy Eg1 of about 1.1 eV, whereas the i type a-Si layer has a band gap energy Eg2 of about 1.88 eV. A depletion layer is formed at the poly-Si layer side. In FIG. 11, a flow of electrons is indicated by arrow 91, whereas a flow of holes is indicated by arrow 92. It is considered that, as shown in the figure, a quantum well qw is created at an interface between the i type a-Si layer and the poly-Si layer, in which electrons accumulate to generate 2DEG. Hereinafter, the region 84 in which 2DEG is generated will be referred to as a "2DEG region".

Figure 12:
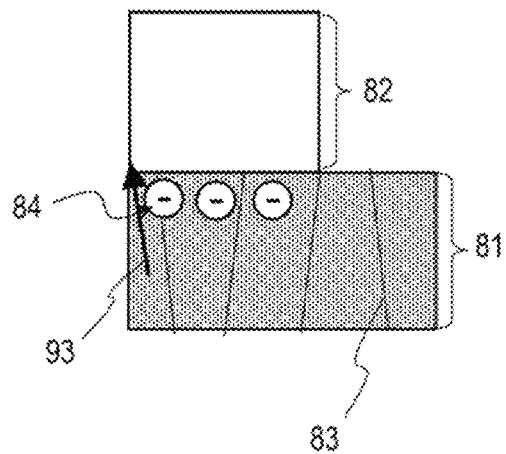
FIG. 12 A schematic enlarged cross-sectional view of an interface between a poly-Si layer and an i type a-Si layer.

FIG. 12 is a schematic enlarged cross-sectional view of the interface between a poly-Si layer 81 and an i type a-Si layer 82. When the poly-Si layer 81 is used as an active layer of a TFT and the i type a-Si layer 82 is used as the lowermost layer of a contact layer, a 2DEG region 84 may emerge at the interface between them. Once the 2DEG region 84 emerges, electrons in the 2DEG region 84 are more likely to move along the grain boundaries in the poly-Si layer 81 (arrow 93) toward the poly-Si layer 82, thus causing an increased leak current.

Next, a capacitance measurement which was conducted by the inventors in order to confirm an occurrence of 2DEG at the interface of a semiconductor heterojunction will be described.

Figure 13:
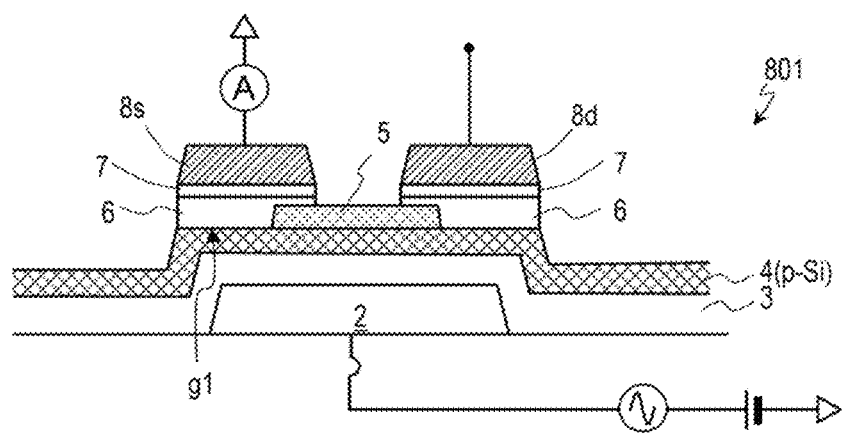
FIGS. 13 (*a*) and (*b*) are schematic cross-sectional views of a heterojunction-containing TFT 801 and a homojunction-containing TFT 802, respectively, that were used for measurement.
Figure 13:
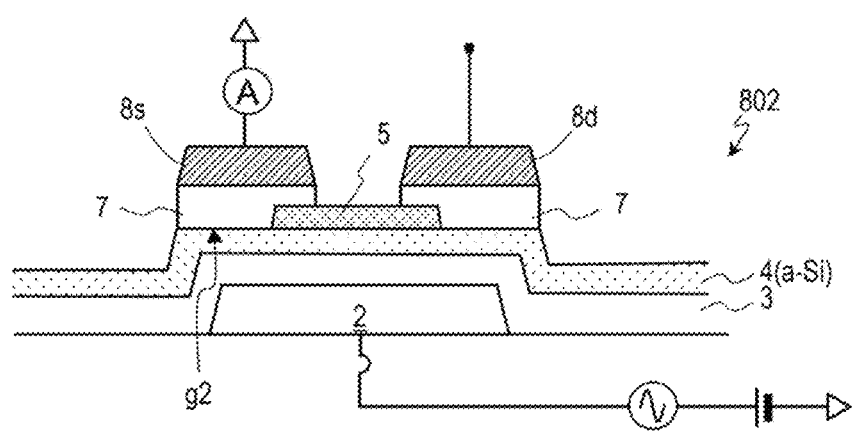

FIGS. 13(a) and (b) are schematic cross-sectional views of ES-type TFTs 801 and 802, respectively, that were used in the capacitance measurement. The TFT 801 is a TFT having a semiconductor heterojunction between the gate and the source/drain (referred to as a "heterojunction-containing TFT"), whereas the TFT 802 is a TFT having a semiconductor homojunction between the gate and the source/drain (referred to as a "homojunction-containing TFT").

The heterojunction-containing TFT 801 includes: a gate electrode 2 formed on a substrate; a gate insulating layer 3 covering the gate electrode 2; a semiconductor layer (active layer) 4 formed on the gate insulating layer 3; a protective insulating layer (etch stop layer) 5 covering a channel region of the semiconductor layer 4; and a source electrode 8s and a drain electrode 8d. The semiconductor layer 4 is a polysilicon layer (poly-Si layer). Between the semiconductor layer 4 and protective insulating layer 5 and the source electrode 8s, and between the semiconductor layer 4 and protective insulating layer 5 and the drain electrode 8d, an i type a-Si layer 6 composed of an intrinsic amorphous silicon and an $n^+$ type a-Si layer 7 composed of $n^+$ type amorphous silicon are disposed in this order as contact layers. The i type a-Si layer 6 and the semiconductor layer are directly in contact. The junction g1 between the semiconductor layer 4, which is a poly-Si layer, and the i type a-Si layer 6 is a semiconductor heterojunction.

On the other hand, the homojunction-containing TFT 802 is similar in configuration to the heterojunction-containing TFT 801, except that an amorphous silicon layer (a-Si layer) is used as the semiconductor layer 4 and that an $n^+$ type a-Si layer 7 is used as the only contact layer. The junction g2 between the semiconductor layer 4, which is an a-Si layer, and the $n^+$ type a-Si layer 7 is a semiconductor homojunction.

By using a TFT monitor and applying an AC current (10 kHz) between the gate and the source, measurements of a capacitance C between the gate and the source were taken for the heterojunction-containing TFT 801 and the homojunction-containing TFT 802.

Figure 14:
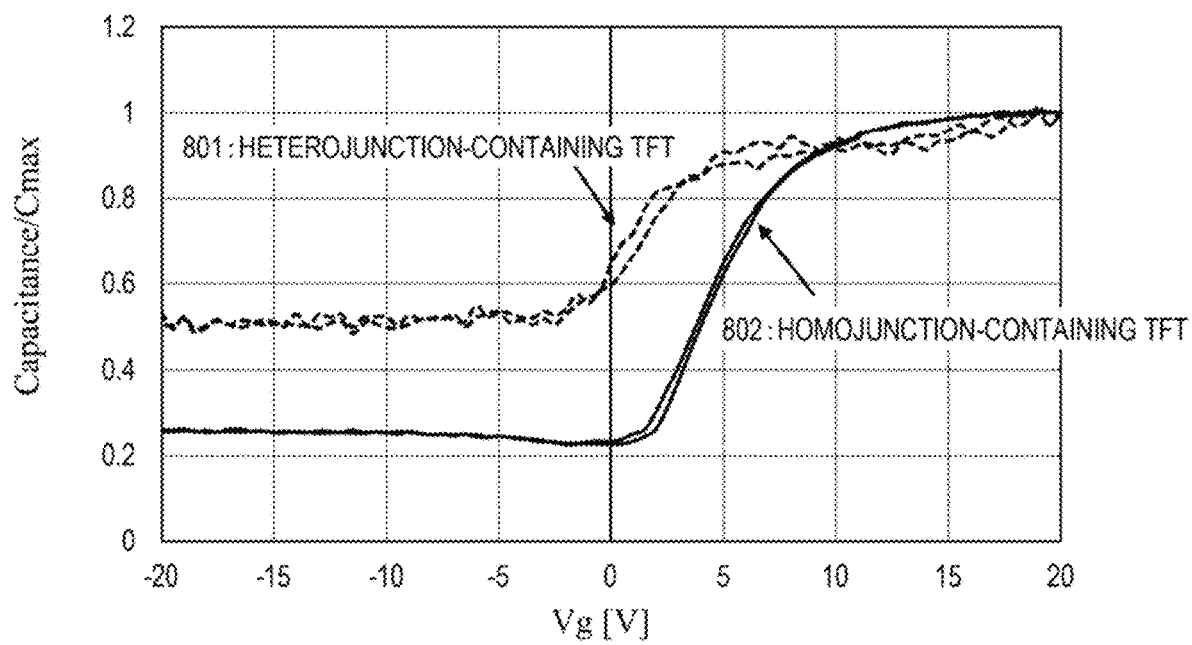
FIG. 14 A diagram showing C-V characteristics of the heterojunction-containing TFT 801 and the homojunction-containing TFT 802.

FIG. 14 is a diagram showing C-V characteristics of the heterojunction-containing TFT 801 and the homojunction-containing TFT 802, where the vertical axis represents capacitance C and the horizontal axis represents gate voltage Vg.

From FIG. 14, it can be seen that there is a smaller change in the capacitance of the heterojunction-containing TFT 801 than there is for the homojunction-containing TFT 802. This is indicative of a difference in carrier concentration (electrons concentration). It is generally known that, as the carrier concentration increases, a semiconductor more closely resembles a metal, thus resulting in a smaller change in capacitance. In the heterojunction-containing TFT 801, electrons are considered to accumulate in the quantum well qw, which is formed at the interface of the junction g1 to cause 2DEG, thus making the carrier concentration correspondingly greater (i.e., because of the electrons distribution in the 2DEG) than that of the homojunction-containing TFT 802. One can confirm from this that 2DEG has been generated at the interface of the semiconductor heterojunction. Note that when a positive voltage is applied as the gate voltage Vg, the electrons having accumulated in the quantum well qw at the interface of the junction g1 are presumably discharged toward the semiconductor layer 4 in the heterojunction-containing TFT 801, thus resulting in a carrier concentration which is similar to that of the homojunction-containing TFT 802.

The inventors have sought for a TFT structure that can suppress the aforementioned 2DEG generation at an interface between an active layer and a contact layer.

The present invention has been made based on Findings I and II above. According to an embodiments of the present invention, there is provided a bottom-gate type TFT that can reduce GIDL by increasing the thickness of a depletion layer(s) to be formed in a contact layer. According to another embodiment of the present invention, there is provided a bottom-gate type TFT that can reduce GIDL by increasing the thickness of a depletion layer(s) to be formed in a contact layer and by suppressing 2DEG generation at an interface between the contact layer and an active layer.

Hereinafter, with reference to the drawings, embodiments of the present invention will be described specifically.

First Embodiment

A thin film transistor (TFT) according to a first embodiment is a polycrystalline silicon TFT of etchstop (ES) type. The TFT of the present embodiment is applicable to circuit boards for active matrix substrates or the like, various display apparatuses such as liquid crystal display apparatuses and organic EL display apparatuses, image sensors, electronic appliances, and so on.

FIG. 1(a) is a schematic plan view of a thin film transistor (TFT) 101 according to the present embodiment, and FIG.

1(b) is a cross-sectional view of the TFT 101 taken along line I-I'. FIG. 1(c) is a schematic enlarged cross-sectional view for describing the structure of a contact layer of the TFT 101.

The TFT 101 is supported on a substrate 1 such as a glass substrate, and includes: a gate electrode 2; a gate insulating layer 3 covering the gate electrode 2; a semiconductor layer (active layer) 4 disposed on the gate insulating layer 3; and a source electrode 8s and a drain electrode 8d electrically connected to the semiconductor layer 4. Between the semiconductor layer 4 and the source electrode 8s, a first contact layer Cs is provided; between the semiconductor layer 4 and the drain electrode 8d, a second contact layer Cd is provided. Between the semiconductor layer 4 and the first contact layer Cs and second contact layer Cd, a protective insulating layer (also referred to as an etch stop layer) 5 is disposed so as to be directly in contact with a portion of the semiconductor layer 4.

The semiconductor layer 4, which layer functions as an active layer of the TFT 101, includes a polysilicon region (poly-Si region) 4p. As shown in the figure, the semiconductor layer 4 may include a poly-Si region 4p and an amorphous silicon region (a-Si region) 4a that mainly contains an amorphous silicon. Alternatively, the entire semiconductor layer 4 may be the poly-Si region 4p.

The poly-Si region 4p includes: a first region Rs and a second region Rd; and a channel region Rc which is located between them and in which a channel of the TFT 101 is formed. The channel region Rc is disposed so as to overlap the gate electrode 2 via the gate insulating layer 3. The first region Rs is electrically connected to the source electrode 8s, whereas the second region Rd is electrically connected to the drain electrode 8d.

The protective insulating layer 5 is disposed on a portion of the semiconductor layer 4, so as to cover the channel region Rc. In this example, the protective insulating layer 5 is disposed in an island shape on the channel region Rc, such that the first region Rs and the second region Rd are not covered by the protective insulating layer 5. A portion of the protective insulating layer 5 is located between the channel region Rc and the first contact layer Cs, while another portion of the protective insulating layer 5 is located between the channel region Rc and the second contact layer Cd. Note that the protective insulating layer 5 does not need to have an island shape. In that case, the protective insulating layer 5 may have apertures through which the first region Rs and the second region Rd of the semiconductor layer 4 are exposed.

The first contact layer Cs is formed on the first region Rs of the semiconductor layer 4. A lower face of the first contact layer Cs may be directly in contact with the first region Rs, and an upper face of the first contact layer Cs may be directly in contact with the source electrode 8s. The source electrode 8s is electrically connected to the first region Rs of the semiconductor layer 4 via the first contact layer Cs. The second contact layer Cd is formed above the second region Rd of the semiconductor layer 4. A lower face of the second contact layer Cd may be directly in contact with the second region Rd, and an upper face of the second contact layer Cd may be directly in contact with the drain electrode 8d. The drain electrode 8d is electrically connected to the second region Rd of the semiconductor layer 4 via the second contact layer Cd. The first contact layer Cs and the second contact layer Cd may be spaced apart from each other.

In the present embodiment, the first contact layer Cs and the second contact layer Cd are each an amorphous silicon layer having a multilayer structure.

With reference to FIG. 1(c), an example of the multilayer structure of the first contact layer Cs and the second contact layer Cd (which may hereinafter be collectively referred to as the "contact layer C") will be described.

As an uppermost layer of the multilayer structure, the contact layer C includes a first amorphous silicon layer (first a-Si layer) 71. The first a-Si layer 71 functions as a contact region to be directly in contact with the source electrode 8s or the drain electrode 8d. Below the first a-Si layer 71, a number N of two-layer structures S(n) ($1 \leq n \leq N$) are formed. The region 70 including the N two-layer structures S(n) is referred to as the "multilayer region".

Each of the two-layer structures S(n) is composed of: a second amorphous silicon layer (second a-Si layer) 72(n); and a third amorphous silicon layer (third a-Si layer) 73(n) that is directly in contact with an upper face of the second a-Si layer 72(n). In each of the two-layer structures S(n), the relationship $C2(n) < C3(n) < C1$ is satisfied for any given n, where C2(n) is a concentration of an n type impurity contained in the second a-Si layer 72(n); C3(n) is a concentration of an n type impurity contained in the third a-Si layer 73(n); and C1 is a concentration of an n type impurity contained in the first a-Si layer 71. The second a-Si layer 72(n) may be an intrinsic a-Si layer that substantially contains no n type impurity.

In the example shown in FIG. 1(c), three (N=3) two-layer structures S(1), S(2) and S(3) are disposed in this order from the first a-Si layer 71. The concentrations C2(1) and C3(1) in the two-layer structure S(1) satisfy $C2(1) < C3(1) < C1$. Similarly, the concentrations C2(2) and C3(2) in the two-layer structure S(2) satisfy $C2(2) < C3(2) < C1$, and the concentrations C2(3) and C3(3) in the two-layer structure S(3) satisfy $C2(3) < C3(3) < C1$. Note that the concentrations C2(1), C2(2) and C2(3) may be equal or different from one another. Similarly, the concentrations C3(1), C3(2) and C3(3) may be equal or different from one another.

As a lowermost layer of the multilayer structure, the contact layer C may further include a fourth amorphous silicon layer (fourth a-Si layer) 74 that is directly in contact with the first region Rs or the second region Rd. Assuming that the concentration of an n type impurity in the fourth a-Si layer 74 is C4, then, $C4 > C2(n)$ may hold for any given n. Preferably, $C4 > C3(n)$.

With the TFT 101 according to the present embodiment, the thickness (a total thickness) of the depletion layer(s) to be formed in the contact layer C can be increased. Hereinafter, the reasons thereof will be described with reference to FIG. 2.

Figure 2:
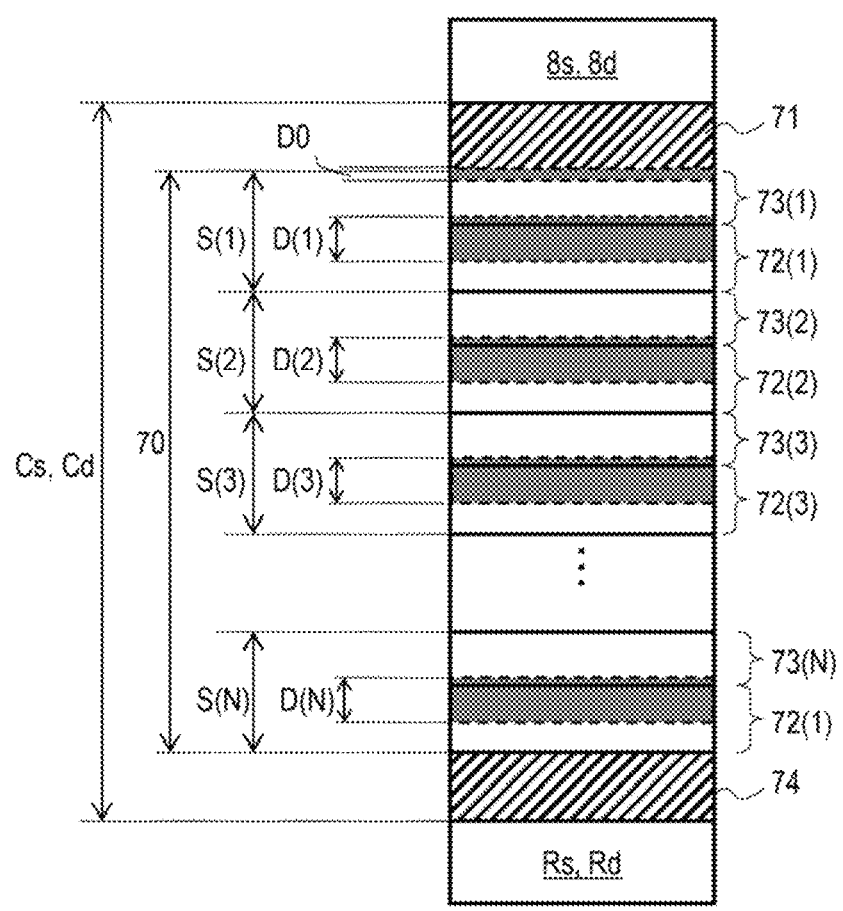
FIG. 2 A schematic cross-sectional view showing depletion layers D formed in the contact layer C.
Figure 3:
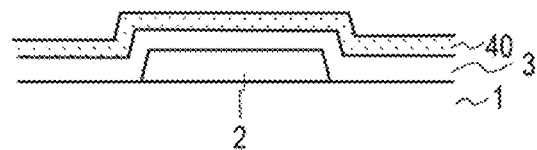
FIG. 3 (*a*) to (*f*) are schematic step-by-step cross-sectional views for describing an example method of producing the TFT 101.
Figure 3:
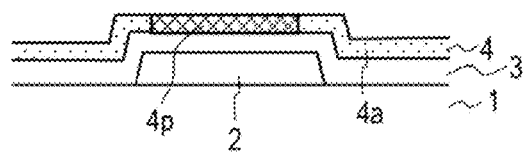
Figure 3:
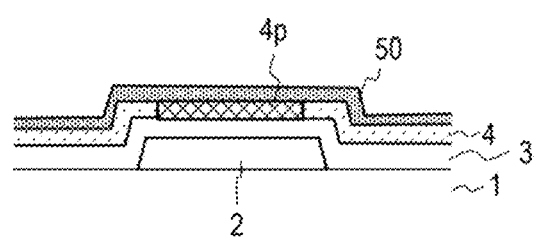
Figure 3:
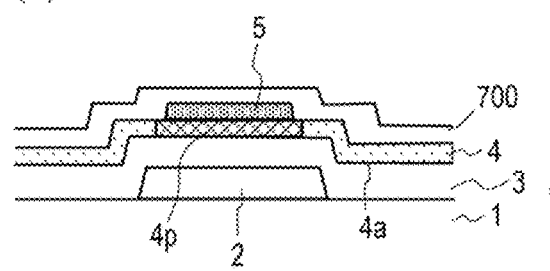
Figure 3:
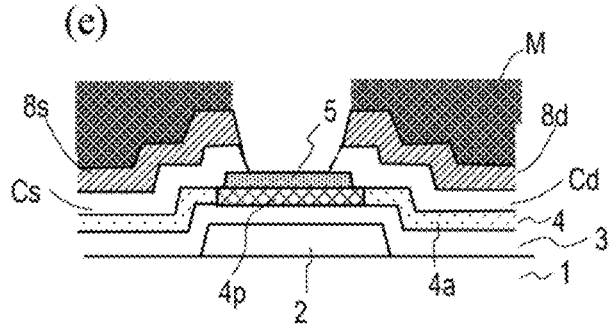
Figure 3:
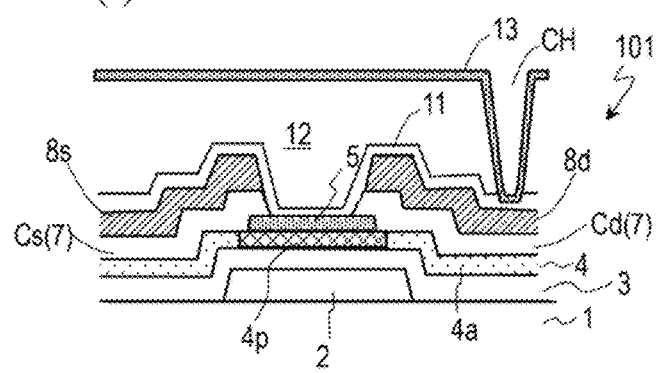

When a reverse bias (negative voltage) is applied to the gate electrode 2 of the TFT 101, as shown in FIG. 2, a depletion layer D(n) is formed at an interface between the second a-Si layer 72(n) and the third a-Si layer 73(n) in each two-layer structure S(n). Each depletion layer D(n) is formed on the second a-Si layer 72(n) side. The thickness of the depletion layer D(n) may be controlled by the concentrations C2(n) and C3(n), for example. The concentration C3(n) is controlled independently of the concentration C1 (and C4), and is set to a predetermined concentration which is lower than the concentration C1. Therefore, a depletion layer D(n) that is thicker than conventional can be formed between the second a-Si layer 72(n) and the third a-Si layer 73(n), thus allowing GIDL to be reduced by the depletion layer D(n).

Although a depletion layer D0 is also formed between the third a-Si layer 73(3) and the first a-Si layer 71, its thickness is smaller than that of the depletion layer D(n).

Moreover, in this example, two or more (e.g., three herein) depletion layers D(1), D(2) and D(3) are formed between the semiconductor layer 4 and the source electrode 8s or drain electrode 8d. The total thickness of the depletion layers D is a sum of the thicknesses of the depletion layers D(1), D(2) and D(3). Thus, by increasing the number of depletion layers D, the total thickness of the depletion layers D can be further increased. Thus, by stacking potential barriers to be tunneled by carriers, they are made thicker in effect, whereby GIDL can be suppressed more effectively.

Note that, in a conventional TFT (e.g. Patent Document 2), an intrinsic amorphous silicon layer (lower layer) may be disposed below an $n^+$ type amorphous silicon layer (upper layer) to become a contact region with a source/drain electrode. In such a TFT, the impurity concentration of the $n^+$ type amorphous silicon layer, which is the upper layer, is set to a concentration which is high enough for functioning as a contact region, and therefore the depletion layer formed at the interface with the lower layer will be thin.

The concentration C1 in the first a-Si layer 71 may be set to any concentration that is suitable as a contact region with an electrode, e.g. not less than $5 \times 10^{19}$ atoms/cm$^3$ and not more than $1 \times 10^{23}$ atoms/cm$^3$. The thickness of the first a-Si layer 71 may be e.g. not less than 10 nm and not more than 50 nm.

The concentration C2(n) in the second a-Si layer 72(n) is e.g. not less than 0 atoms/cm$^3$ and not more than $1 \times 10^{17}$ atoms/cm$^3$. The second a-Si layer 72(n) may contain substantially no n type impurity. For example, the concentration C2(n) in the second a-Si layer 72(n) may be equal to or smaller than the measurement limit by SIMS (e.g., $1 \times 10^{17}$ atoms/cm$^3$ or less by the apparatus used herein). The thickness of the second a-Si layer 72(n) may be e.g. not less than 5 nm and not more than 20 nm, and preferably not less than 10 nm and not more than 20 nm.

The concentration C3(n) in the third a-Si layer 73(n) is e.g. not less than $1.2 \times 10^{17}$ atoms/cm$^3$ and not more than $4 \times 10^{19}$ atoms/cm$^3$. For any given n, the concentration C3(n) may be equal to or greater than five times the concentration C2(n). This allows a depletion layer D(n) to be formed between the third a-Si layer 73(n) and the second a-Si layer 72(n) with greater certainty. The thickness of the third a-Si layer 73(n) may be e.g. greater than 0 nm but not greater than 20 nm, and preferably not less than 10 nm and not more than 20 nm. The thickness of the second a-Si layer 72(n) may be equal to or greater than the thickness of the third a-Si layer 73(n). This allows a thicker depletion layer D(n) to be formed.

Although not particularly limited, the number N of stacks of the two-layer structures S(n) in the contact layer C may be e.g. 2 or more, preferably 3 or more, more preferably 5 or more, whereby the total thickness of the depletion layer(s) D can be made greater so that a more outstanding effect is obtained. Although there is no limitation as to the upper limit value of N, too large an N may cause film delamination. N may be e.g. 20 or less. The thickness of the entire contact layer C may be e.g. not less than 100 nm and not more than 300 nm. In the present embodiment, i.e., an ES-type TFT having the protective insulating layer 5, there is no need to leave an a-Si film above the channel region 4s in order to protect the channel region 4s; therefore, the thickness of the contact layer C can be kept to 20 nm or less.

Moreover, the lowermost layer in the contact layer C may be a second a-Si layer 72(N). Alternatively, below the multilayer region 70, a fourth a-Si layer 74 may be provided as the lowermost layer in the contact layer C, the fourth a-Si layer 74 containing an n type impurity at a concentration C4 which is higher than the concentration C2(n) in the second a-Si layer 72(n). By providing the fourth a-Si layer 74 so as to be directly in contact with the semiconductor layer 4, the resistance at the interface between the semiconductor layer 4 and the contact layer C can be reduced, whereby a decrease in the ON current can be suppressed.

In the present embodiment, the concentration C4 of an n type impurity in the fourth a-Si layer 74 is set even higher (e.g., higher than the concentration C3(n)). This allows for suppressing the GIDL associated with a two-dimensional electron gas (2DEG). The reasons there of are described below.

As has been described above with reference to FIG. 11 and FIG. 12, at the junction interface between a poly-Si layer and an i type a-Si layer, electrons will accumulate in the quantum well qw to generate 2DEG. 2DEG may be a cause for an increased leak current (GIDL).

The problem of a leak current associated with 2DEG may occur when the Fermi levels of the poly-Si layer and the a-Si layer to become the lowermost layer in the contact layer prior to junction are of a relationship that allows the aforementioned quantum well qw to be formed as a result of the junction (FIG. 11). In particular, at an interface between a poly-Si layer that does not contain any conductivity-imparting impurity (i.e., non-doped) and an a-Si layer that substantially does not contain an impurity (i.e., intrinsic), an increase in the leak current owing to the 2DEG region will be significant.

On the other hand, even in a semiconductor heterojunction between a poly-Si layer and an a-Si layer, if the Fermi levels of the poly-Si layer and the a-Si layer prior to junction are of a relationship that does not allow the aforementioned quantum well qw to be formed (or, if at all a quantum well qw is formed, it will be small) as a result of the junction, electrons are unlikely to accumulate at the junction portion, and thus 2DEG is unlikely to be generated.

Figure 10:
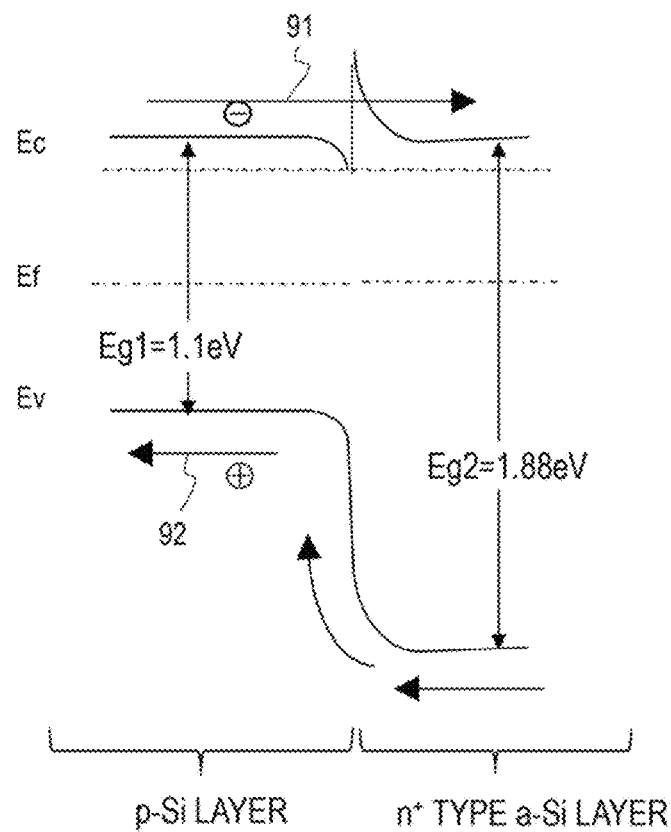
FIG. 10 A diagram showing an energy band structure near a junction interface between a poly-Si layer and an $n^+$ type —Si layer.

FIG. 10 is a schematic diagram for describing another example of the energy band structure near the interface of a semiconductor heterojunction. This illustrates a semiconductor heterojunction that is created by disposing an a-Si layer ($n^+$ type a-Si layer) that contains an impurity on a non-doped poly-Si layer (active layer). The Fermi levels of the poly-Si layer and the $n^+$ type a-Si layer prior to junction are of a relationship that does not allow a quantum well qw to be formed as a result of the junction.

Therefore, electrons are unlikely to accumulate at the junction portion between the poly-Si layer and the $n^+$ type a-Si layer, whereby 2DEG generation is suppressed.

In the TFT 101 according to the present embodiment, the first region Rs and the second region Rd of the semiconductor layer 4 are polysilicon regions (e.g., non-doped polysilicon regions), and also the fourth a-Si layer 74 is disposed so as to be directly in contact with the polysilicon regions. The fourth a-Si layer 74 is an $n^+$ type a-Si layer that contains an n type impurity at the concentration C4, which is higher than the concentration C3. Therefore, as illustrated in FIG. 10, 2DEG is unlikely to be generated at the interface between the semiconductor layer 4 and the fourth a-Si layer 74 (or, if at all it is generated, the electron density in the 2DEG region is small). Therefore, GIDL associated with 2DEG can be suppressed, so that an OFF-leak current can be reduced more effectively.

The concentration C4 in the fourth a-Si layer 74 is set to a concentration that can suppress 2DEG generation, and is e.g. not less than $5 \times 10^{19}$ atoms/cm$^3$ and not more than $1 \times 10^{23}$ atoms/cm$^3$. The thickness of the fourth a-Si layer 74 may be e.g. not less than 5 nm and not more than 20 nm.

When it is not less than 5 nm, 2DEG generation can be suppressed. When it is not more than 20 nm, an increase in the thickness of the entire contact layer can be suppressed.

Note that the structure of each amorphous silicon layer in the contact layer C can be expressed in terms of electrical resistivity (specific resistance) ρ [Ω·cm], instead of the concentrations C1 to C4 of an n type impurity. An electrical resistivity ρ becomes lower as the concentration of the n type impurity increases. In other words, the relationship ρ2(n)>ρ3(n)>ρ1 is satisfied for any given n, where ρ2(n) is an electrical resistivity of the second amorphous silicon layer $72(n)$ in each of the two-layer structures S(n); ρ3(n) is an electrical resistivity of the third amorphous silicon layer $73(n)$; and ρ1 is an electrical resistivity of the first amorphous silicon layer 71. Moreover, in the case where the contact layer C includes the fourth a-Si layer 74, assuming that the electrical resistivity of the fourth a-Si layer 74 is ρ4, then, ρ4<ρ2(n) may hold for any given n. Preferably, ρ4<ρ3(n). The electrical resistivities ρ1 and ρ4 may be e.g. 300 Ω·cm or less. The electrical resistivity ρ2 may be e.g. equal to or greater than the measurement limit (e.g. $1\times10^5$ Ω·cm or more herein). The electrical resistivity ρ3 may be e.g. not less than 500 Ω·cm but less than 90000 Ω·cm.

<Method of Producing the TFT 101>

Next, an example of a method of producing the TFT 101 will be described.

FIG. 3(a) to FIG. 3(f) are schematic step-by-step cross-sectional views for describing an example of a method of producing the TFT 101.

First, as shown in FIG. 3(a), on a substrate 1, a gate electrode 2, a gate insulating layer 3, and an a-Si film 40 for the active layer are formed in this order.

As the substrate 1, a substrate having a dielectric surface, e.g., a glass substrate, a silicon substrate, or a plastic substrate (resin substrate) having heat resistance, can be used.

The gate electrode 2 is formed by forming an electrically conductive film for the gate on the substrate 1, and patterning it. Herein, for example, an electrically conductive film for the gate (thickness: e.g. about 500 nm) is formed on the substrate 1 by sputtering, and the metal film is patterned by using a known photolithography process. For the etching of the gate electrically conductive film, wet etching may be used, for example.

The material of the gate electrode 2 may be: an elemental metal such as molybdenum (Mo), tungsten (W), copper (Cu), chromium (Cr), tantalum (Ta), aluminum (Al), or titanium (Ti); a material composed of these with nitrogen, oxygen, or other metals contained therein; or a transparent electrically conductive material such as indium tin oxide (ITO).

The gate insulating layer 3 is formed on the substrate 1 having the gate electrode 2 formed thereon, by a plasma CVD technique, for example. As the gate insulating layer (thickness: e.g. about 0.4 μm) 3, for example, a silicon oxide (SiO$_2$) layer, a silicon nitride (SiNx) layer, or a multilayer film of an SiO$_2$ layer(s) and an SiNx layer(s) may be formed.

The a-Si film 40 for the active layer may be formed by a CVD technique by using a hydrogen gas (H$_2$) and a silane gas (SiH$_4$), for example. The a-Si film 40 for the active layer may be a non-doped amorphous silicon film that substantially does not contain any n type impurity. A non-doped amorphous silicon film is an a-Si film which is formed without intentional addition of an n type impurity (e.g. by using a material gas that does not contain any n type impurity). Note that the a-Si film 40 for the active layer may contain an n type impurity at a relatively low concentration.

The thickness of the a-Si film 40 for the active layer may be not less than 20 nm and not more than 70 nm (e.g. 50 nm).

Next, as shown in FIG. 3(b), within the a-Si film 40 for the active layer, at least a portion to become the channel region of the TFT is irradiated with laser light 30. As the laser light 30, ultraviolet laser such as XeCl excimer laser (wavelength 308 nm), or solid laser of a wavelength or 550 nm or less, such as a second harmonic (wavelength 532 nm) of YAG laser, may be used. Through irradiation of laser light 30, the region of the a-Si film 40 for the active layer that is irradiated with the laser light 30 melts and solidifies, whereby a poly-Si region 4p is formed. Thus, a semiconductor layer 4 including the poly-Si region 4p is obtained. In the poly-Si region 4p, crystal grains have grown in columnar shapes toward the upper face of the semiconductor layer 4.

There is no particular limitation as to the crystallization method using laser light 30. For example, laser light 30 from a laser light source may be passed through a microlens array so that the laser light 30 is converged onto only a portion of the a-Si film 40 for the active layer, thereby partly crystallizing the a-Si film 40 for the active layer. In the present specification, this crystallization method is referred to as "local laser annealing". By using local laser annealing, as compared to the conventional laser annealing where the entire surface a-Si film is scanned with linear laser light, the time required for crystallization can be greatly reduced, whereby mass producibility can be promoted.

The microlens array includes a two-dimensional or linear arrangement of microlenses. When a plurality of TFTs are formed on the substrate 1, the laser light 30 is converged by the microlens array so as to be incident, within the a-Si film 40 for the active layer, only on a plurality of predetermined regions (irradiation regions) which are spaced apart from one another. Each irradiation region is disposed correspondingly to the portion of a TFT to become the channel region. The positions, number, shapes, sizes, etc., of irradiation regions can be controlled by the size and the array pitch of the microlens array (which is not limited to lenses under 1 mm), the opening positions in a mask that is disposed on the light source side of the microlens array, and the like. As a result, each region of the a-Si film 40 for the active layer that has been irradiated with the laser light 30 is heated to melt and solidify, thus becoming the poly-Si region 4p. Any region that has not been irradiated with the laser light remains as the a-Si region 4a. When viewed from the normal direction of the substrate 1, the a-Si region 4a may be disposed outside the poly-Si region 4p, for example.

As to the more specific method of local laser annealing, the configuration (including the microlens array, mask structure) of the apparatus used for local laser annealing, the entire disclosure of International Publication No. 2011/055618, International Publication No. 2011/132559, International Publication No. 2016/157351, and International Publication No. 2016/170571 is incorporated herein by reference.

Next, as shown in FIG. 3(c), a protective insulating film 50 to become a protective insulating layer (etch stop layer) is formed on the semiconductor layer 4. Herein, as the protective insulating film 50, a silicon oxide film (SiO$_2$ film) is formed by the CVD technique. The thickness of the protective insulating film 50 may be not less than 30 nm and not more than 300 nm, for example. Thereafter, although not shown, the semiconductor layer 4 may be subjected to a dehydrogenation annealing treatment (e.g. 450° C., 60 minutes).

Then, as shown in FIG. 3(d), the protective insulating film 50 is patterned, thereby providing a protective insulating layer 5 covering the portion of the semiconductor layer 4 to become the channel region. At the source side and the drain side of the portion to become the channel region, portions of the poly-Si region 4p are exposed from the protective insulating layer 5. The exposed portions become the first region and the second region to be connected to the contact layers Cs and Cd.

Next, on the semiconductor layer 4, an Si film for the contact layer is formed. Herein, by plasma CVD technique, a multilayer film (thickness: e.g. about 150 nm) 700 is formed. As for the multilayer film 700, first, a fourth a-Si film (thickness: e.g. 10 nm) 740 containing an n type impurity (which herein is phosphorus) at the concentration C4 is formed. Next, a two-layer structure S(1) is formed. The two-layer structure S(1) is formed by depositing, in this order: a second a-Si film (thickness: e.g. 15 μnm) 720 containing an n type impurity at the concentration C2(1); and a third a-Si film (thickness: e.g. 10 nm) 730 that is directly in contact with an upper face of the second a-Si film 720, the third a-Si film containing an n type impurity at the concentration C3(n). Then, by a similar method, N two-layer structures(n) are formed. Thereafter, a first a-Si film (thickness: e.g. 15 nm) 710 containing an n type impurity (which herein is phosphorus) at the concentration C1 is formed. For each amorphous silicon film, as the material gas, a gaseous mixture of silane, hydrogen, and phosphine ($PH_3$) is used. The flow rate of phosphine (the ratio of flow rate of phosphine relative to silane) is adjusted as appropriate, so that the phosphorus concentration in the amorphous silicon film attains a desired value. In the case where an intrinsic amorphous silicon film is formed as the second a-Si film 720, a gaseous mixture that contains silane and hydrogen but substantially does not contain phosphine ($PH_3$) is used as the material gas.

In forming the multilayer structure of the contact layer C, after one a-Si layer is formed and before forming an a-Si layer thereabove, supply of the material gas may be once suspended. The duration of suspending the supply of the material gas is referred to as a "suspension time" or "stabilization time". This allows the concentration and thickness in each a-Si layer to be controlled more precisely with greater certainty, whereby effects of depletion layer barriers can be realized. Alternatively, while continuously supplying the material gas, the ratio of flow rate of the n type impurity (e.g., the ratio of flow rate of phosphine relative to silane) may be changed with appropriate timing, thereby forming a contact layer C that has a concentration distribution along the thickness direction.

Next, on the Si film for the contact layers (which herein is an $n^+$ type a-Si film 70), an electrically conductive film for the source and the drain electrode (thickness: e.g. about 0.3 μm) and a resist mask M are formed. The electrically conductive film for the source and the drain electrode is formed with a material similar to that for the electrically conductive film for the gate, by a method similar to that used for the electrically conductive film for the gate.

Thereafter, by using the resist mask M, the electrically conductive film for the source and the drain electrode and the $n^+$ type a-Si film 70 are patterned by dry etching, for example. As a result, as shown in FIG. 3(e), a source electrode 8s and a drain electrode 8d are formed from the electrically conductive film (source-drain separation step). Moreover, from the $n^+$ type a-Si film 70, $n^+$ type a-Si layers 7 to become a first contact layer Cs and a second contact layer Cd are formed so as to be spaced apart from each other. During the patterning, the protective insulating layer 5 functions as an etchstop, so that the portion of the semiconductor layer 4 that is covered by the protective insulating layer 5 is not etched. The ends of the first contact layer Cs and the second contact layer Cd that are closer to the channel are located on an upper face of the protective insulating layer 5. Thereafter, the resist mask M is removed off the substrate 1. Thus, the TFT 101 is produced.

In order to deactivate dangling bonds in the poly-Si region 4p and reduce the defect density, the poly-Si region 4p may be subjected to a hydrogen plasma treatment after the source-drain separation step.

In the case where the TFT 101 is used as a pixel TFT of an active matrix substrate, as shown in FIG. 3(f), an interlayer insulating layer is formed so as to cover the TFT 101. Herein, as the interlayer insulating layer, an inorganic insulating layer (passivation film) 11 and an organic insulating layer 12 are formed.

As the inorganic insulating layer 11, a silicon oxide layer, a silicon nitride layer, or the like may be used. Herein, as the inorganic insulating layer 11, an SiNx layer (thickness: e.g. about 200 nm) is formed by the CVD technique, for example. The inorganic insulating layer 11 is in contact with the protective insulating layer 5 in (a gap) between the source electrode 8s and the drain electrode 8d.

The organic insulating layer 12 may be an organic insulating film (thickness: e.g. 1 to 3 μm) containing a photosensitive resin material, for example. Thereafter, the organic insulating layer 12 is patterned, and an aperture is formed therein. Next, by using the organic insulating layer as a mask, the inorganic insulating layer 11 is etched (dry etching). As a result, a contact hole CH that reaches the drain electrode 8d is formed in the inorganic insulating layer 11 and the organic insulating layer 12.

Next, a transparent electrically conductive film is formed on the organic insulating layer 12 and in the contact hole CH. As the material for the transparent electrode film, a metal oxide such as indium-tin oxide (ITO), indium-zinc oxide, or ZnO can be used. Herein, by e.g. sputtering, an indium-zinc oxide film (thickness: e.g. about 100 nm) is formed as the transparent electrically conductive film.

Thereafter, the transparent electrically conductive film is patterned by e.g. wet etching, thereby providing a pixel electrode 13. The pixel electrode 13 is to be disposed so as to be each spaced apart, from pixel to pixel. Each pixel electrode 13 is in contact with the drain electrode 8d of the corresponding TFT within the contact hole. Although not illustrated, the source electrode 8s of the TFT 101 is electrically connected to a source bus line (not shown), while the gate electrode 2 is electrically connected to a gate bus line (not shown).

The semiconductor layer 4, the first contact layer Cs, and the second contact layer Cd may be patterned into island shapes in the region where the TFT 101 is formed (TFT formation region). Alternatively, the semiconductor layer 4, the first contact layer Cs, and the second contact layer Cd may extend to regions other than the region where the TFT 101 is formed (TFT formation region). For example, the semiconductor layer 4 may extend so as to overlap a source bus line that is connected to the source electrode 8s. It suffices if the portion of the semiconductor layer 4 that is located in the TFT formation region contains the poly-Si region 4p; the portion extending to regions other than the TFT formation region may be the a-Si region 4a.

Moreover, the crystallization method of the a-Si film 40 for the active layer is not limited to the aforementioned local laser annealing. A part or a whole of the a-Si film 40 for the active layer may be crystallized by using other known methods.

(Variants)

Figure 1:
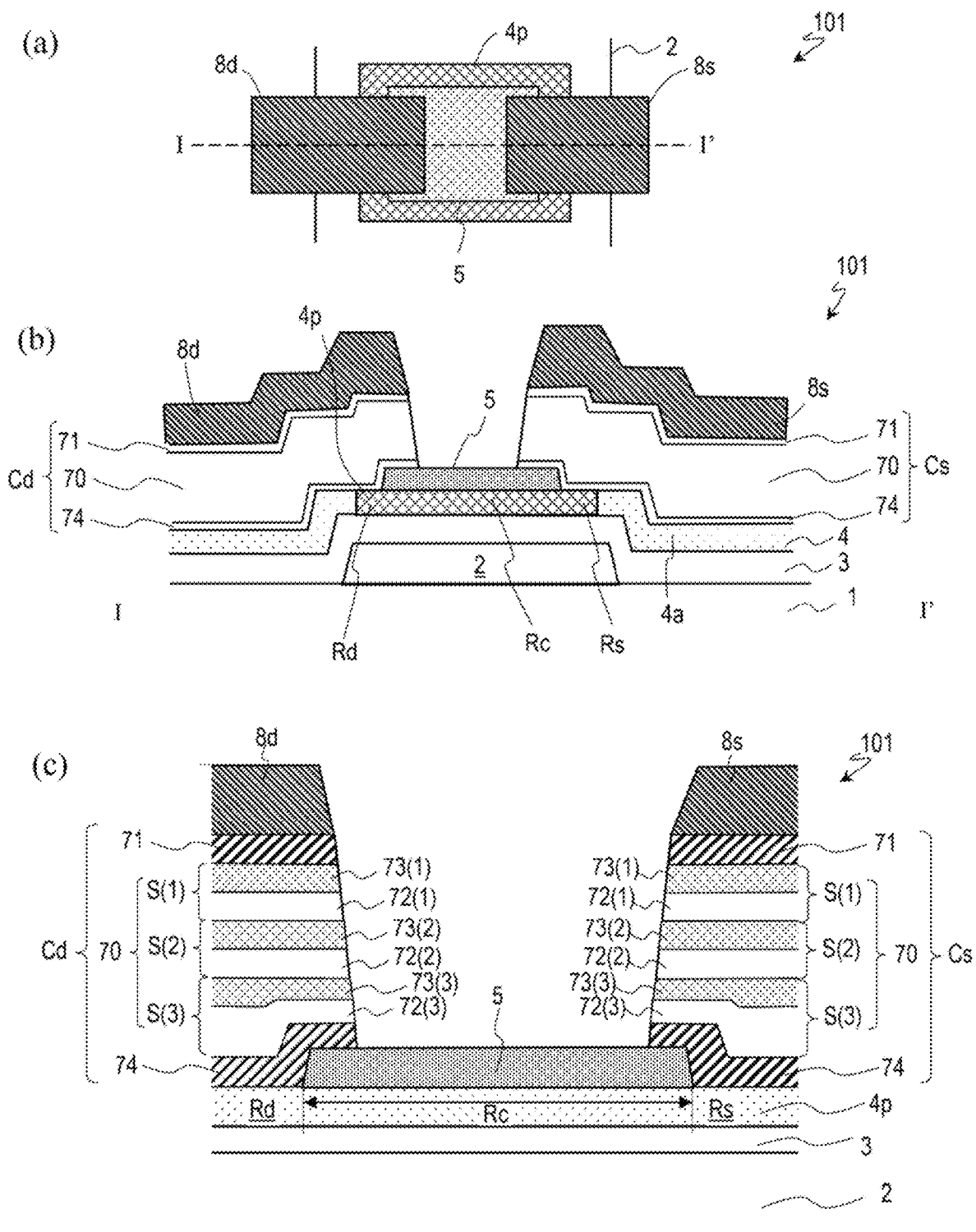
FIGS. 1 (*a*) and (*b*) are a schematic plan view and a cross-sectional view, respectively, of a TFT 101 according to the first embodiment. (*c*) is a schematic enlarged cross-sectional view of a contact layer of the TFT 101.
Figure 4:
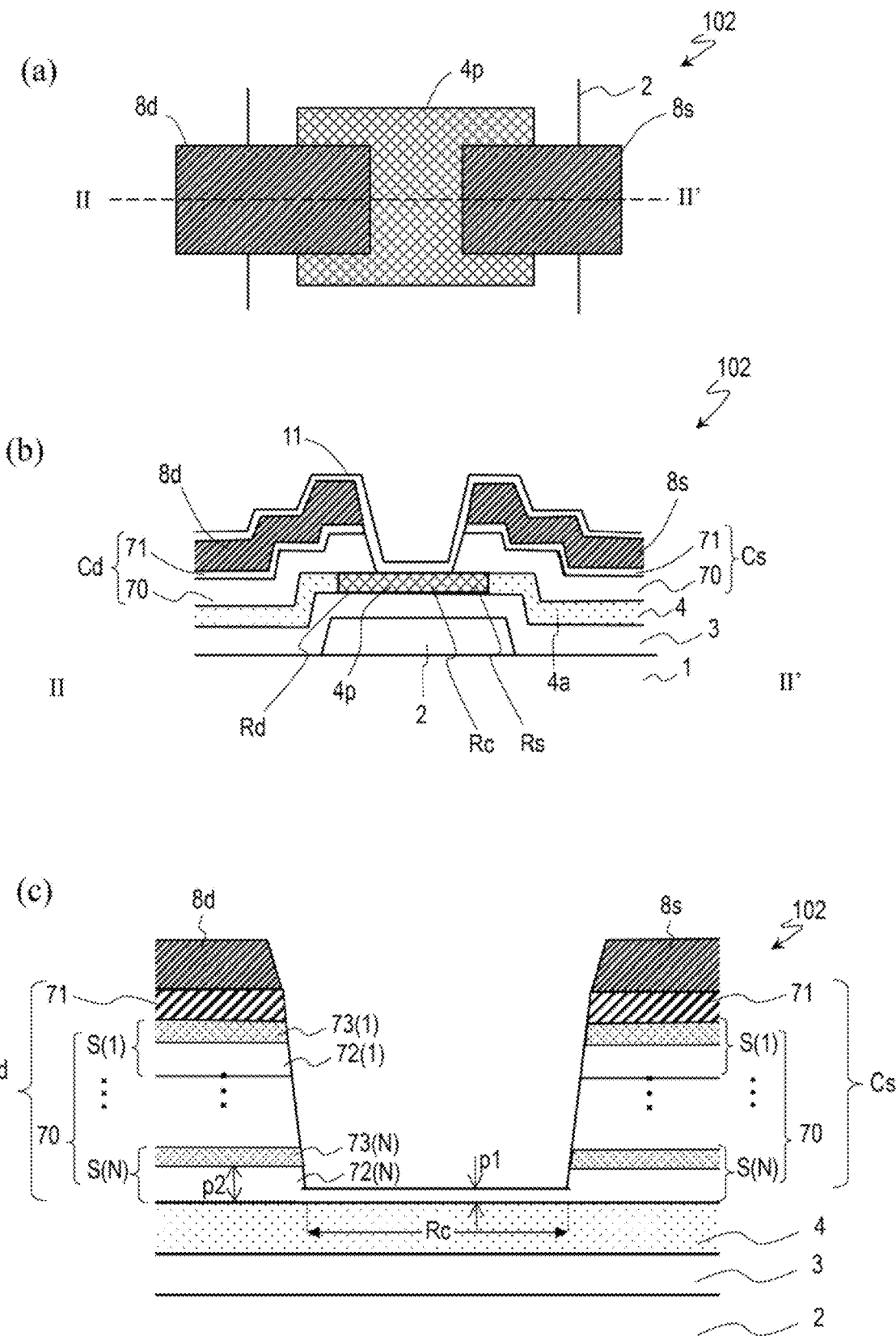
FIGS. 4 (*a*) and (*b*) are a schematic plan view and a cross-sectional view, respectively, of a TFT 102 according to Variant 1; and (*c*) is a schematic enlarged cross-sectional view of a contact layer of the TFT 102.

FIG. 4(a) is schematic plan views of a TFT 102 according to Variant 1 of the present embodiment, where FIG. 4(b) is a cross-sectional view of the TFT 102 taken along line II-II'. Variant 1 is a polycrystalline silicon TFT of channel-etch (CE) type. In FIG. 4, constituent elements similar to those in FIG. 1 are denoted by identical reference numerals. In the following, description may conveniently be omitted for any aspects of the configuration similar to those of the TFT 101 in FIG. 1.

In the TFT 102, no etch stop layer (the protective insulating layer 5 shown in FIG. 1) that covers the channel region Rc is provided between the semiconductor layer 4 and the source electrode 8s and drain electrode 8d. The inorganic insulating layer 11 is directly in contact with the channel region Rc of the semiconductor layer 4 between the source electrode 8s and the drain electrode 8d.

The first contact layer Cs and the second contact layer Cd include: a first a-Si layer 71; and a multilayer region 70 including N (e.g. 3 herein) two-layer structures S(1), S(2) and S(3). A lowermost layer (i.e., the layer that is directly in contact with the first region Rs or the second region Rd) of the first contact layer Cs and the second contact layer Cd is a second a-Si layer 72(N) of the two-layer structure S(N). The second a-Si layer 72(N) may not be separated into the source side and the drain side, but left in the channel region Rc. With such configuration, in the source-drain separation step, damage to the channel region Rc is reduced, whereby a decrease in the reliability of the TFT 102 can be suppressed.

The lowermost layer, i.e., the second a-Si layer 72(N), may be an intrinsic amorphous silicon layer which substantially does not contain any impurity that confers electrically conductivity. This allows the entire channel region Rc to be protected without permitting electrical conduction between the source and the drain.

The TFT 102 may be produced by a method similar to that for the TFT 101. However, no protective insulating layer is formed. In the source-drain separation step, patterning of the electrically conductive film and the multilayer film may be performed under conditions that will leave a lower portion of the second a-Si layer 72(N) (which is the lowermost layer of the multilayer film) above the channel region 4s. In this case, the thickness p1 of the portion of the second a-Si layer 72(N) that is located above the channel region Rc may be smaller than the thickness p2 of the portion that is located above the first region Rs and the second region Rd. From the standpoint of protecting the channel region Rc with the second a-Si layer 72(N) with greater certainty (i.e., p1>0), the thickness of the second a-Si layer 72(N) may be e.g. 10 nm or more.

Figure 5:
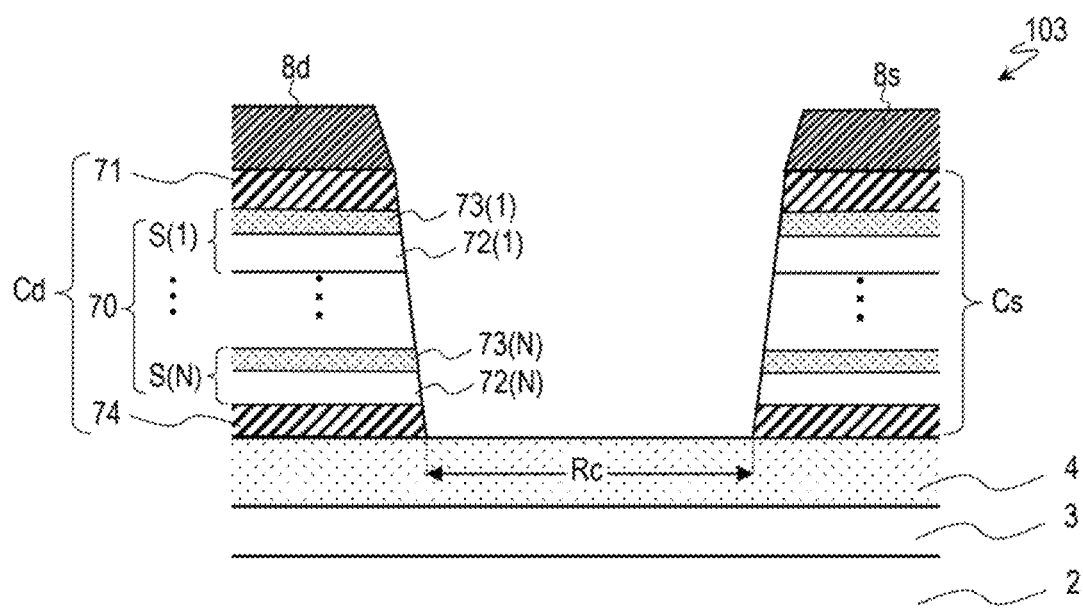
FIG. 5 A schematic enlarged cross-sectional view of a contact layer of a TFT according to Variant 2.
Figure 6:
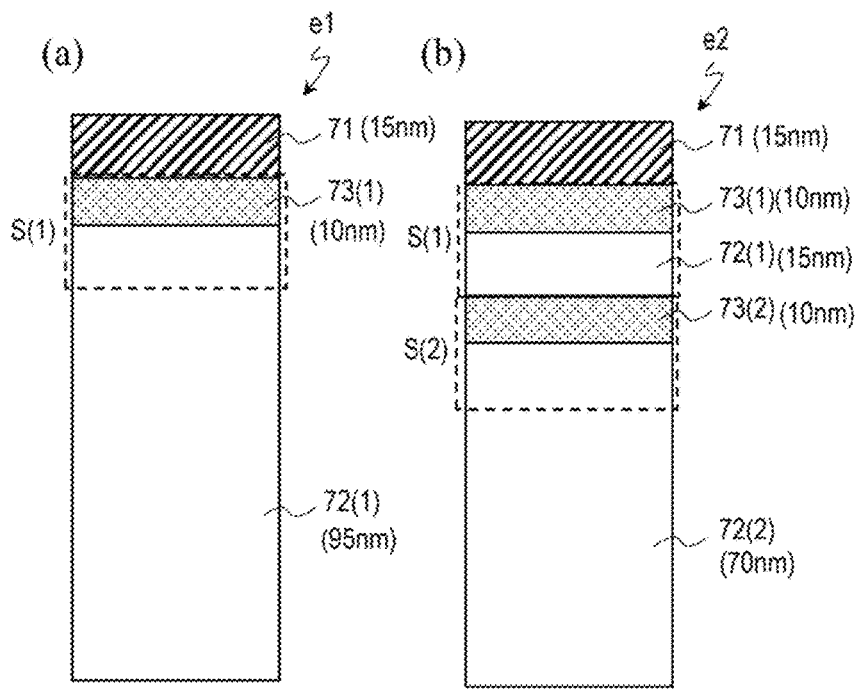
FIG. 6 (*a*) to (*e*) are schematic cross-sectional views of multilayer structures e1 to e4 and r1 of contact layers in TFTs according to Examples 1 to 4 and Comparative Example, respectively.
Figure 6:
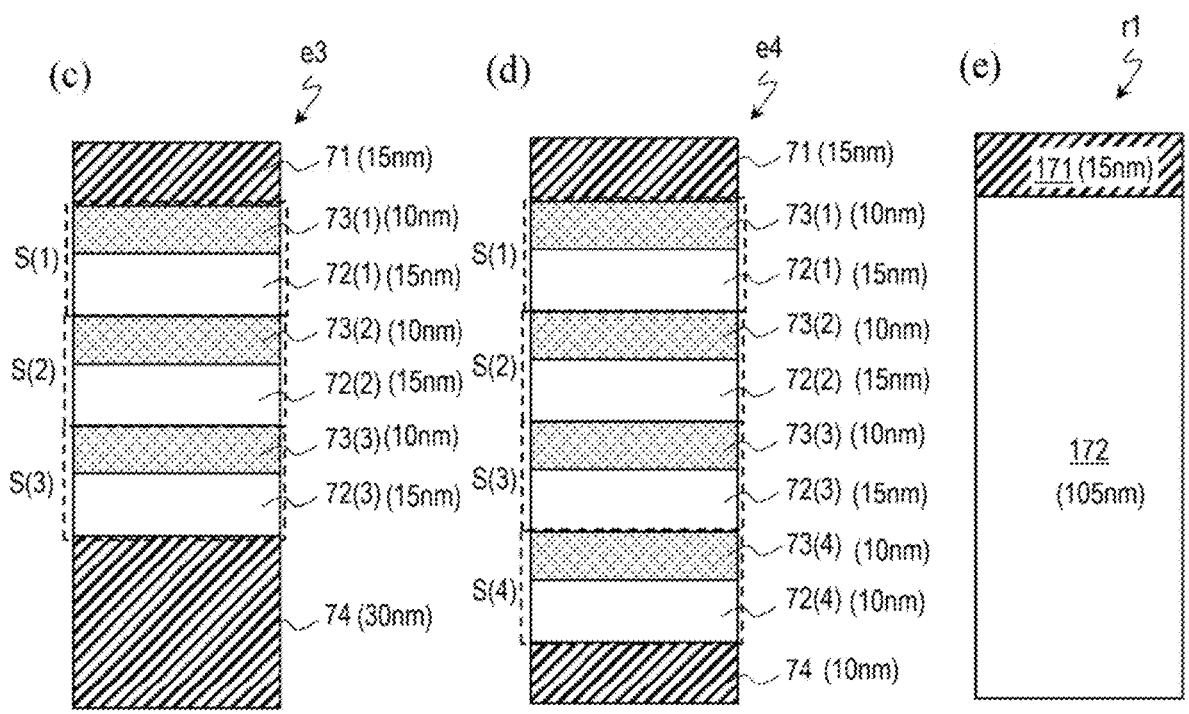

FIG. 5 is a cross-sectional view of a TFT 103 according to Variant 2 of the present embodiment. Variant 2 differs from Variant 1 in that the contact layer C includes, as the lowermost layer, a fourth a-Si layer 74 that contains an n type impurity at the concentration C4. Providing the fourth a-Si layer 74 allows for an effect of reducing GIDL associated with 2DEG. In Variant 2, at the source-drain separation step, the fourth a-Si layer 74 is also separated into the source side and the drain side. At this time, the neighborhood of the surface of the channel region Rc of the semiconductor layer 4 may also become etched (overetching).

Example and Comparative Examples

TFTs according to Examples and Comparative Example and were produced, and their TFT characteristics were evaluated.

TFTs of Examples 1 to 4 and Comparative Example are ES-type bottom gate TFTs similar to the TFT 101 shown in FIG. 1. However, they differ from one another with respect to the structure of the contact layer C. For each TFT, the thickness of the semiconductor layer, the conditions of laser irradiation (energy density, pulse width, number of shots) for the semiconductor layer by laser annealing technique, and the number N of stacks in the contact layer are shown in Table 1. Note that the thickness of the entire contact layer is 120 nm in all cases.

TABLE 1

| | contact layer structure | | semiconductor layer | | TFT characteristics | |
|---|---|---|---|---|---|---|
| | number N of two-layer structures S(n) | fourth amorphous silicon layer | thickness of semiconductor layer (nm) | conditions of laser irradiation | mobility of TFT (cm$^2$/Vs) | minimum value of OFF current Ioff (A) |
| Comp. Ex. | 0 | NO | 50 | 290 mJ, 80 ns 20 shots | 4.54 | 3.0 × 10$^{-10}$ |
| Ex. 1 | 1 | NO | 50 | 290 mJ, 80 ns 20 shots | 4.63 | 1.9 × 10$^{-10}$ |
| Ex. 2 | 2 | NO | 50 | 270 mJ, 80 ns 20 shots | 3.58 | 2.9 × 10$^{-11}$ |
| Ex. 3 | 3 | YES phosphorus concentration 5 × 10$^{18}$ cm$^{-3}$ | 40 | 330 mJ, 80 ns 20 shots | 8.95 | 9.0 × 10$^{-12}$ |
| Ex. 4 | 4 | YES phosphorus concentration 1 × 10$^{20}$ cm$^{-3}$ | 30 | 250 mJ, 50 ns 5 shots | 9.62 | 3.9 × 10$^{-12}$ |

FIGS. 6(a) to (e) are schematic diagrams showing multilayer structures e1 to e4 and r1 of the contact layer C in the TFTs of Examples 1 to 4 and Comparative Example, respectively.

The multilayer structures e1 to e4 of the contact layer C in Examples 1 to 4 include an n$^{++}$ type first a-Si layer 71 (phosphorus concentration: 1×10$^{20}$ cm$^{-3}$) and 1 to 4 two-layer structures S(n). Each two-layer structure S(n) is composed of a second a-Si layer 72 that substantially does not contain phosphorus (phosphorus concentration: measurement limit or below), and an n$^+$ type third a-Si layer 73 (phosphorus concentration: 5×10$^{18}$ cm$^{-3}$). In Example 1 and 2, the second a-Si layer 72(1), 72(2) is the lowermost layer. On the other hand, in Example 3, n$^+$ type fourth a-Si layer 74 (phosphorus concentration: 5×10$^{18}$ cm$^{-3}$) is used as the lowermost layer; in Example 4, an n$^{++}$ type fourth a-Si layer (phosphorus concentration: 1×10$^{20}$ cm$^{-3}$) is used as the lowermost layer.

On the other hand, the multilayer structure r1 of the contact layer C in Comparative Example includes an n$^{++}$ type a-Si layer 171 (phosphorus concentration: 1×10$^{20}$ cm$^{-3}$, thickness: 15 nm) and an i type a-Si layer 172 (thickness: 105 nm) that substantially does not contain phosphorus (phosphorus concentration: measurement limit or below). The i type a-Si layer 172 is the lowermost layer. No two-layer structures S(n) are formed below the n$^{++}$ type a-Si layer 171 (N=0).

The method of producing the TFTs of Examples 1 to 4 and Comparative Example is similar to the method described above with reference to FIG. 3. Formation of the contact layer C of each TFT was performed by CVD technique. At this time, by adjusting the ratio of the flow rate of the material gas, each multilayer structure including a plurality of a-Si layers of different phosphorus concentrations was formed.

As an example, the conditions of formation for each a-Si layer included in the multilayer structure e4 of the contact layer C in Example 4 are shown in Table 2. In Table 2, "deposition time" is the duration of supplying the material gas (second), and "stabilization time" is the duration for which the supply of the material gas was suspended (second) after forming that layer and before beginning deposition of the next layer. Herein, every time an a-Si layer was formed, supply of the material gas was once suspended (i.e., stabilization time>0 (second)). Moreover, the inter-electrode distance (spacing) was all 700 (mils).

Figure 8:
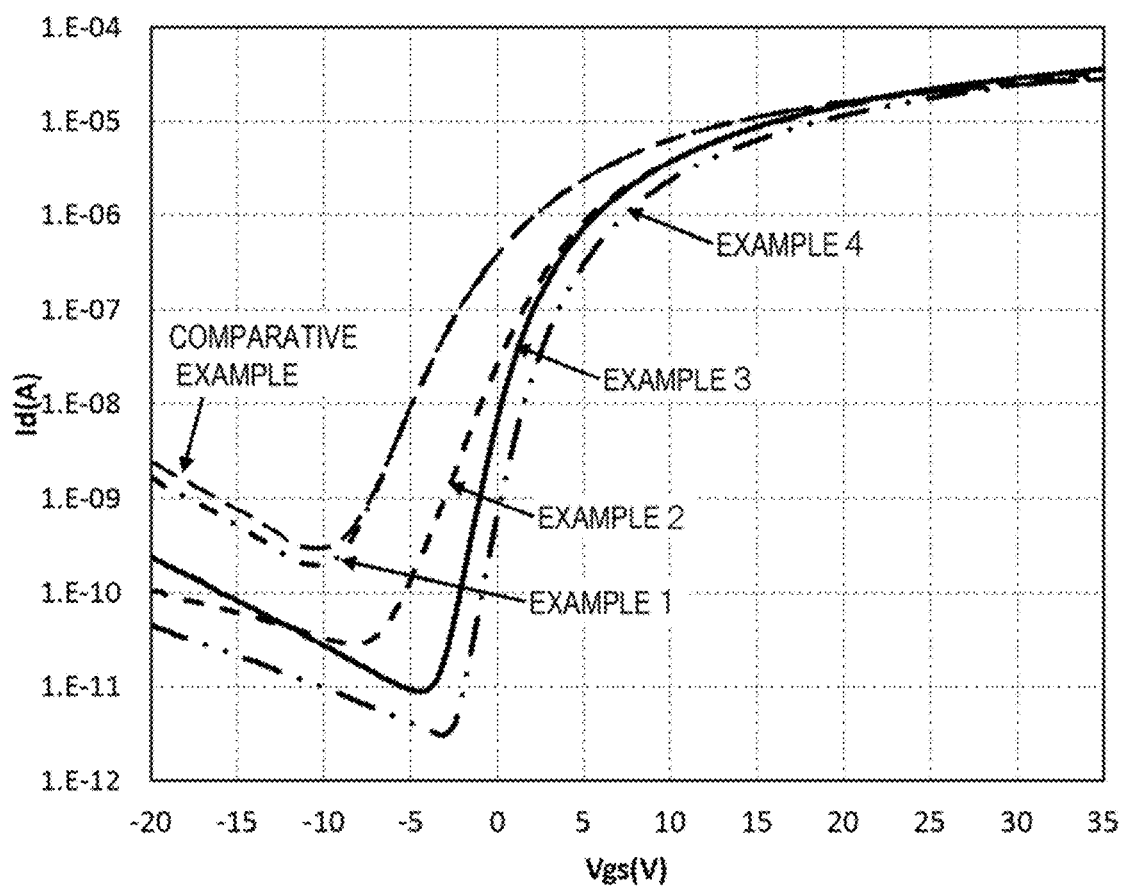
FIG. 8 A diagram showing V-I characteristics of the TFTs according to Examples 1 to 4 and Comparative Example.

As can be seen from FIG. 8, in the TFTs of Examples 1 to 4, GIDL is improved as compared to the TFT of Comparative Example, and the OFF current Ioff is lower. The OFF current Ioff is governed by GIDL, and is caused by an inter-band tunneling current flowing due to a high electric field in the region of overlap between the gate and the drain. In the TFTs of Examples 1 to 4, presumably, the depletion layers formed in the contact layer C became thick, thereby reducing the inter-band tunneling current, whereby the OFF current Ioff decreased. Moreover, it can be seen that, as the number N of two-layer structures S(n) included in the contact layer C increases, Vth shifts in the plus direction and the OFF current Ioff decreases. This is considered to be because a greater number N of two-layer structures S(n) increased the number of depletion layers formed, thus resulting in a larger total thickness of the depletion layer(s) and a greater reduction in the inter-band tunneling current.

Furthermore, in the TFTs of Examples 3 and 4, in which an $n^+$ type or $n^{++}$ type fourth a-Si layer 74 was provided as the lowermost layer in the contact layer C, the OFF current (GIDL) when the gate voltage Vgs was closer to the threshold voltage was particularly improved, whereby the V-I characteristics rose steeply. This is presumably because providing the fourth a-Si layer 74 made it less likely for a 2DEG region to occur in the junction portion between the contact layer C and the semiconductor layer 4, whereby the high electric field associated with 2DEG in the region of

TABLE 2

| | | thickness (nm) | deposition time (sec) | stabilization time (sec) | RF (W) | pressure in chamber (mtorr) | material gas flow rate (sccm) | | |
|---|---|---|---|---|---|---|---|---|---|
| | | | | | | | $SiH_4$ | $PH_3\_SiH_4$ | $H_2$ |
| | first a-Si layer 71 | 15 | 30 | 1 | 2900 | 1800 | 11450 | 3000 | 80000 |
| S(1) | third a-Si layer 73(1) | 10 | 3 | 2 | 19200 | 2100 | 27000 | 500 | 80000 |
| | second a-Si layer 72(1) | 15 | 37 | 1 | 2900 | 2000 | 14500 | — | 80000 |
| S(2) | third a-Si layer 73(2) | 10 | 3 | 2 | 19200 | 2100 | 27000 | 500 | 80000 |
| | second a-Si layer 72(2) | 15 | 37 | 1 | 2900 | 2000 | 14500 | — | 80000 |
| S(3) | third a-Si layer 73(3) | 10 | 3 | 2 | 19200 | 2100 | 27000 | 500 | 80000 |
| | second a-Si layer 72(3) | 15 | 37 | 1 | 2900 | 2000 | 14500 | — | 80000 |
| S(4) | third a-Si layer 73(4) | 10 | 3 | 2 | 19200 | 2100 | 27000 | 500 | 80000 |
| | second a-Si layer 72(4) | 10 | 3 | 2 | 21600 | 2000 | 27500 | — | 60000 |
| | fourth a-Si layer 74 | 10 | 20 | 3 | 2900 | 1800 | 11450 | 3000 | 80000 |

Figure 7:
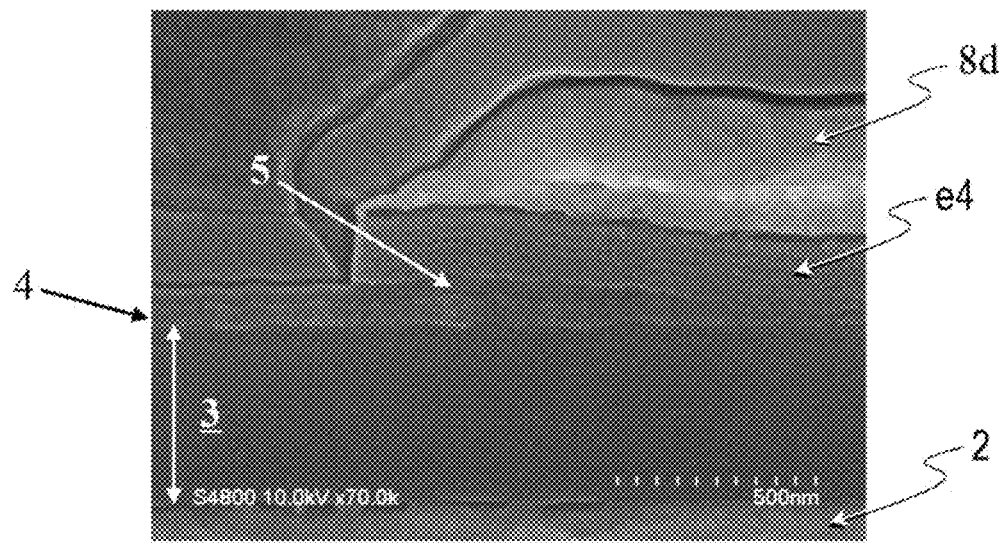
FIG. 7 A cross-sectional SEM image of the contact layer of the TFT according to Example 4.

FIG. 7 is a cross-sectional SEM image of the contact layer of the TFT of Example 4.

FIG. 8 is a diagram showing the V-I (gate voltage Vgs-drain current Id) characteristics of the TFTs of Examples 1 to 4 and Comparative Example. Moreover, minimum values of the mobility and OFF current of the TFT of each Example and Comparative Example are also shown in Table 1.

overlap was alleviated, thus reducing GIDL. It can be seen that providing a fourth a-Si layer 74 of a high concentration ($n^{++}$ type) particularly reduces GIDL more effectively.

<Measurement of Electrical Resistivity $\rho$>

Electrical resistivities $\rho 1$ to $\rho 4$ of the a-Si layers 71 to 74 in the contact layer C of Example 4 were measured by the following method.

As Samples a1 to a4, an amorphous silicon film (thickness: 200 to 300 nm) containing an n type impurity was produced. Samples a1 to a4 were respectively formed under the same conditions as those for the a-Si layers 71 to 74 in Example 4, and contained an n type impurity at essentially the same concentrations as those in the a-Si layers 71 to 74. Electrical resistivities $\rho(a1)$ to $\rho(a4)$ of Samples a1 to a4 are essentially equal to the electrical resistivities $\rho 1$ to $\rho 4$ of the a-Si layers 71 to 74 in Example 4.

electrical resistivities $\rho(a1)$ to $\rho(a4)$s of the Samples a1 to a4 were measure by using a 4-terminal resistance measurement method, which indicated that the electrical resistivities $\rho(a1)$ and $\rho(a4)$ of Samples a1 and a4 were both 31.9 $\Omega \cdot cm$ and that the electrical resistivity $\rho(a3)$ of Sample a3 was 1370 $\Omega \cdot cm$. Moreover, the electrical resistivity $\rho(a2)$ of Sample a2 was greater than the measurement limit, being more than $1 \times 10^5$ $\Omega \cdot cm$. From this result, it was confirmed that the electrical resistivities $\rho 1$ and $\rho 4$ of the first a-Si layer 71 and the fourth a-Si layer were 31.9 $\Omega \cdot cm$; the electrical resistivity $\rho 3$ of the third a-Si layer 73 was 1370 $\Omega \cdot cm$; and the electrical resistivity $\rho 2$ of the second a-Si layer 72 was more than $1 \times 10^5$ $\Omega \cdot cm$, indicative that $\rho 2(n) > \rho 3(n) > \rho 1, \rho 4$.

<Concentration Profile of the n Type Impurity Along the Depth Direction of the Contact Layer>

Next, by taking the TFT of Example 4 as an example, a concentration profile of the n type impurity along the depth direction of the contact layer according to the present embodiment will be described. The concentration profile along the depth direction can be measured by secondary ion mass spectrometry (SIMS), for example.

Figure 9:
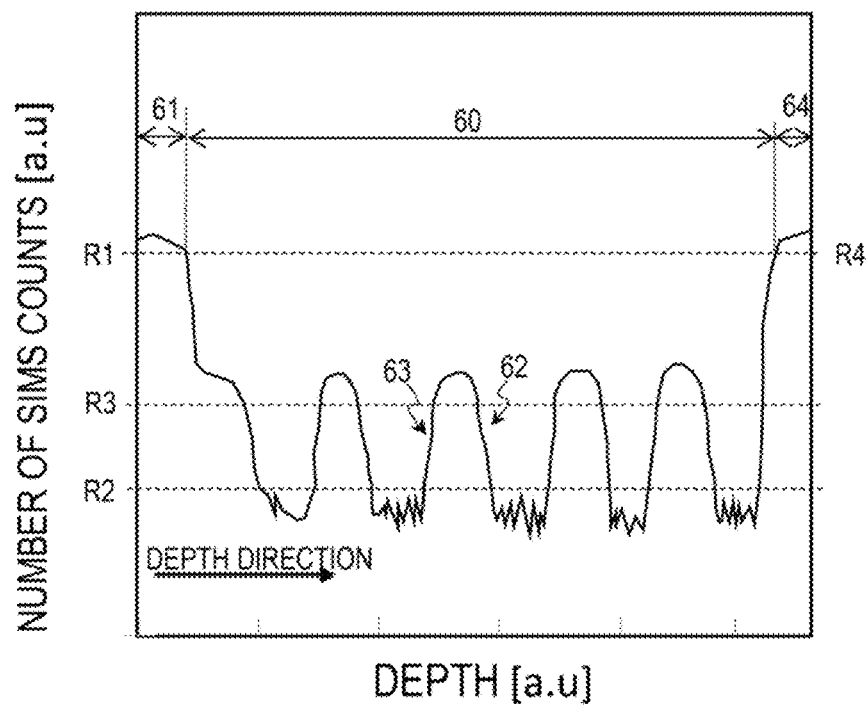
FIG. 9 A diagram showing schematically showing a profile along the depth direction of a phosphorus concentration of the contact layer of the TFT according to Example 4.

FIG. 9 is a diagram schematically showing a concentration profile of an n type impurity (which herein is phosphorus) along the depth direction of the contact layer of the TFT of Example 4. The "depth direction" refers to the direction from the source electrode or drain electrode toward the semiconductor layer.

The concentration profile includes: a contact region (also referred to as an "upper contact region") 61 which is disposed in contact with the source/drain electrode, where the phosphorus concentration is R1 or more; and a concentration-modulated region 60 located between the contact region 61 and the active layer (i.e., the semiconductor layer 4 shown in FIG. 1). At the semiconductor layer 4 side of the concentration-modulated region 60, a contact region (also referred to as a "lower contact region") 64 may be further included so as to be in contact with the semiconductor layer 4.

The contact region 61 corresponds to the first a-Si layer 71. The concentration R1 is greater than C3 but equal to or smaller than C1 (C3<R1≤C1), e.g. $4.5 \times 10^{19}$ atoms/cm³.

The concentration-modulated region 60 is a region in which the concentration profile of the n type impurity varies along the depth direction, and corresponds to the multilayer region 70 including N two-layer structures S(n). The concentration-modulated region 60 includes: a first gradient region(s) 62, which includes a portion where the concentration of the n type impurity along the depth direction decreases from R3 to R2 within a range of 20 nm; and a second gradient region(s) 63, which includes a portion where the concentration of the n type impurity along the depth direction increases from R2 to R3 within a range of 20 nm. The concentrations R2 and R3 satisfy the relationship R2<R3<R1. As an example, the concentration R2 is equal to or greater than C2 but smaller than C3 (C2≤R2<C3), e.g. $1.5 \times 10^{17}$ atoms/cm³. The concentration R3 is greater than C2 but equal to or smaller than C3 (C2<R3≤C3), e.g. $4.5 \times 10^{17}$ atoms/cm³. The concentration-modulated region 60 may include two or more first gradient regions 62 and two or more second gradient regions 63, these alternating with each other. The first gradient region 62 may be a portion of a region where the concentration decreases from a local maximum to a local minimum, and the second gradient region 63 may be a portion of a region where the concentration increases from a local minimum to a local maximum.

The contact region 64 corresponds to the fourth a-Si layer 74. The contact region 64 is a region of concentration R4 or more, for example. The concentration R4 is greater than C2 (C2<R4), and may preferably be greater than C3. The concentration R4 may be equal to or smaller than C4; and as shown in the figure, R4=R1 may hold.

A low-concentration region located on the semiconductor layer 4 side of each first gradient region 62, where the concentration is essentially constant (FIG. 9 reveals some noise because of the measurement limit of SIMS) corresponds to the second a-Si layer 72; and a high concentration region, located on the electrode side of each first gradient region 62, where the concentration is essentially constant, corresponds to the third a-Si layer 73.

The concentration-modulated region 60 is a region where the depletion layer(s) may be formed. In the first gradient region 62, the n type impurity concentration may decrease by two orders of magnitude or more. Similarly, in the second gradient region 63, the n type impurity concentration increase by two orders of magnitude or more. Since a depletion layer is formed in each first gradient region 62, inclusion of two or more first gradient regions 62 results in two or more depletion layers being formed, whereby the total thickness of the depletion layer(s) can be increased.

The contact layer C in the present embodiment may have a concentration profile as described with reference to FIG. 9, and the method of forming the same (conditions of formation) is not limited to the method illustrated in Table 2.

The entire contact layer C, or a portion(s) of the contact layer C (e.g., the concentration-modulated region 60) may be consecutively formed by CVD technique. In that case, the ratio of flow rate of the impurity-containing gas (an n type impurity-containing gas, e.g., $PH_3$) contained in the material gas may be switched (where switching is inclusive of zeroing the flow rate of the impurity-containing gas) with predetermined timing, a contact layer C having a desired concentration profile along the thickness direction can be formed.

For example, after the fourth a-Si layer 74 is formed on the semiconductor layer 4, supply of the material gas may be once suspended, and then, while changing the ratio of the impurity-containing gas to the material gas, N two-layer structures S(n) (corresponding to the concentration-modulated region 60) may be consecutively formed. Thereafter, after observing a suspension time (stabilization time) of the material gas, the first a-Si layer 71 may separately be formed. Alternatively, N two-layer structures S(n) and a first a-Si layer 71 may be consecutively formed on the fourth a-Si layer 74.

Hereinafter, by taking the contact layer C of the TFT of Example 4 as an example, a method of consecutively forming the contact layer C (i.e., a multilayer film to become the contact layer C) by CVD will be described.

Conditions of formation for the contact layer C are shown in Table 3. The thickness of each a-Si layer is only an approximate guide. In this example, after the fourth a-Si layer 74 is formed, two-layer structures S(1) to S(4) and the first a-Si layer 71 are consecutively formed. In other words, after forming the fourth a-Si layer 74, a stabilization time (3 seconds) may be observed only before the second a-Si layer 72(4), and no stabilization time is observed after the formation of any other a-Si layer. The inter-electrode distance is all 700 (mils).

TABLE 3

|  |  | thickness (nm) | deposition time (sec) | stabilization time (sec) | RF (W) | pressure in chamber (mtorr) | material gas flow rate (sccm) $SiH_4$ | $PH_3$_$SiH_4$ | $H_2$ |
|---|---|---|---|---|---|---|---|---|---|
|  | first a-Si layer 71 | 15 | 37 | — | 2600 | 1800 | 11450 | 3000 | 80000 |
| S(1) | third a-Si layer 73(1) | 10 | 3 | — | 21600 | 2000 | 27000 | 500 | 80000 |
|  | second a-Si layer 72(1) | 15 | 4 |  |  |  | 27500 | — | 60000 |
| S(2) | third a-Si layer 73(2) | 10 | 3 |  |  |  | 27000 | 500 | 80000 |
|  | second a-Si layer 72(2) | 15 | 4 |  |  |  | 27500 | — | 60000 |
| S(3) | third a-Si layer 73(3) | 10 | 3 |  |  |  | 27000 | 500 | 80000 |
|  | second a-Si layer 72(3) | 15 | 4 |  |  |  | 27500 | — | 60000 |
| S(4) | third a-Si layer 73(4) | 10 | 3 |  |  |  | 27000 | 500 | 80000 |
|  | second a-Si layer 72(4) | 10 | 4 |  |  |  | 27500 | — | 60000 |
|  | fourth a-Si layer 74 | 10 | 25 | 3 | 2600 | 1800 | 11450 | 3000 | 80000 |

A contact layer C having a concentration profile as described with reference to FIG. 9 can also be obtained by the method of consecutively formation. Note that, when a concentration-modulated region 60 including N two-layer structures S(n) is formed consecutively, the concentration profile of the concentration-modulated region 60 may become more rounded (blunted) than in the case of once stopping supply of the material gas every time after forming an a-Si layer. For example, the gradient regions 62 and 63 may become thick (i.e., the concentration gradient becomes gentle). Moreover, the concentration profile in the region located between the gradient regions 62 and 63 may not become flat.

A TFT according to the present embodiment may be any bottom-gate type TFT that includes a contact layer C having the multilayer structure or concentration profile described above, and its structure is not limited to the structures illustrated in FIG. 1 to FIG. 5. Moreover, a TFT according to the present embodiment is not limited to a polysilicon TFT. It may be an amorphous silicon TFT using an amorphous silicon layer as an active layer (semiconductor layer 4), or a microcrystalline silicon TFT using a microcrystalline silicon layer. It may also be an oxide semiconductor TFT using an oxide semiconductor layer. The oxide semiconductor layer may be amorphous or crystalline. The crystalline oxide semiconductor may be a polycrystalline oxide semiconductor, a microcrystalline oxide semiconductor, a crystalline oxide semiconductor whose c axis is oriented essentially perpendicular to the layer plane, for example. The material, structure, method of film formation, etc., of an amorphous or crystalline oxide semiconductor are described in the specification of Japanese Patent No. 6275294, for example. The entire disclosure of the specification of Japanese Patent No. 6275294 is incorporated herein by reference.

A TFT according to the present embodiment can be suitably used for an active matrix substrate of a display apparatus or the like, for example. An active matrix substrate (or a display apparatus) has a displaying region that includes a plurality of pixels and a non-displaying region (also referred to as a peripheral region) other than the displaying region. For each pixel, a pixel TFT is provided as a switching element. In the peripheral region, gate drivers or other driving circuits may be monolithically formed. The driving circuits include a plurality of TFTs ("referred to as circuit TFTs"). A TFT according to the present embodiment may be used as each pixel TFT and/or each circuit TFT.

The aforementioned active matrix substrate is suitably used for a liquid crystal display apparatus. For example, a counter substrate having a counter electrode and a color filter layer may be provided; the active matrix substrate and the counter substrate may be attached together via a sealant; and liquid crystal may be injected between these substrates, a liquid crystal display apparatus is obtained.

Without being limited to a liquid crystal display apparatus, any material of which optical property can be modulated or which can emit light upon voltage application may be used as a display medium layer, whereby various display apparatuses can be obtained. For example, the active matrix substrate according to the present embodiment can be suitably used for display apparatuses such as an organic EL display apparatus or an inorganic EL display apparatus in which an organic or inorganic phosphor material is used as a display medium layer. Furthermore, it can also be suitably used as an active matrix substrate for use in an X-ray sensor, a memory device, or the like.

INDUSTRIAL APPLICABILITY

Embodiments of the present invention are broadly applicable to apparatuses and electronic appliances that include TFTs, for example: circuit boards of active matrix substrates or the like; display apparatuses such as liquid crystal display apparatuses, organic electroluminescence (EL) display apparatus, and inorganic electroluminescence display apparatuses; imaging devices such as radiation detectors and image sensors; electronic devices such as image input devices and fingerprint reader devices, and the like.

REFERENCE SIGNS LIST

1: substrate, 2: gate electrode, 3: gate insulating layer, 4: semiconductor layer, 4a: a-Si region, 4p: poly-Si region, 5: protective insulating layer, 6: i type a-Si layer, 7: n$^+$ type a-Si layer, 8d: drain electrode, 8s: source electrode, 9: 2DEG region, 10: i type a-Si islet, 11: inorganic insulating layer, 12: organic insulating layer, 13: pixel electrode, 30: laser light, 40: active layer a-Si film, 50: insulating film, 60: concentration-modulated region, 61: contact region (upper contact region), 62: first gradient region, 63: second gradient region, 64: contact region (lower contact region), 70: multilayer region, 71: first amorphous silicon layer (first a-Si layer), 72(1), 72(2), 72(3), 72(N): second amorphous silicon layer (second a-Si layer), 73(1), 73(2), 73(3), 73(N): third amorphous silicon layer (third a-Si layer), 74: fourth amorphous silicon layer (fourth a-Si layer), 80: electrically conductive film, 700: multilayer film, Cs: first contact layer, Cd: second contact layer, D(1), D(2), D(3), D0 depletion layer, e1, e2, e3, e4, r1: multilayer structure, M: resist mask, Re: channel region, Rd: second region, Rs: first region, S(1), S(2), S(3), S(N): two-layer structure

The invention claimed is:

1. A thin film transistor comprising:
a substrate;
a gate electrode supported by the substrate;
a gate insulating layer covering the gate electrode;
a semiconductor layer disposed on the gate insulating layer, the semiconductor layer including a first region, a second region, and a channel region that is located between the first region and the second region;
a first contact layer disposed above the first region of the semiconductor layer;
a second contact layer disposed above the second region of the semiconductor layer;
a source electrode disposed on the first contact layer, the source electrode being electrically connected to the first region via the first contact layer; and
a drain electrode disposed on the second contact layer, the drain electrode being electrically connected to the second region via the second contact layer, wherein,
the first and second contact layers each have a multilayer structure;
the multilayer structure includes
a first amorphous silicon layer that is directly in contact with the source electrode or the drain electrode,
N (where N is an integer equal to or greater than 1) two-layer structures S(n) (where n is an integer not smaller than 1 and not greater than N), each two-layer structure S(n) comprising a second amorphous silicon layer and a third amorphous silicon layer that is directly in contact with an upper face of the second amorphous silicon layer, and
a fourth amorphous silicon layer that is directly in contact with the first region or the second region of the semiconductor layer;
the relationship C2(n)<C3(n)<C1 is satisfied for any given n, where C2(n) is a concentration of an n type impurity contained in the second amorphous silicon layer of each of the two-layer structures S(n); C3(n) is a concentration of an n type impurity contained in the third amorphous silicon layer; and C1 is a concentration of an n type impurity contained in the first amorphous silicon layer; and
the relationship C3(n)<C4 is satisfied for any given n, where C4 is a concentration of an n type impurity contained in the fourth amorphous silicon layer.

2. The thin film transistor of claim 1, wherein N is 3 or more.

3. The thin film transistor of claim 1, wherein N is 5 or more.

4. The thin film transistor of claim 1, wherein the second amorphous silicon layer and the third amorphous silicon layer in the each two-layer structure S(n) respectively have a thickness of 20 nm or less.

5. The thin film transistor of claim 1, wherein an electrical resistivity ρ1 of the first amorphous silicon layer is 300 Ω·cm or less; an electrical resistivity ρ2 of the second amorphous silicon layer is $1\times10^5$ Ω·cm or more; and an electrical resistivity ρ3 of the third amorphous silicon layer is not less than 500 Ω·cm but less than 90000 Ω·cm.

6. The thin film transistor of claim 1, wherein the concentration C1 is not less than $5\times10^{19}$ atoms/cm$^3$ and not more than $1\times10^{23}$ atoms/cm$^3$.

7. The thin film transistor of claim 1, wherein,
the concentration C3(n) is not less than $1.2\times10^{17}$ atoms/cm$^3$ and not more than $4\times10^{19}$ atoms/cm$^3$; and
the concentration C2(n) is not less than 0 and not more than $1\times10^{17}$ atoms/cm$^3$.

8. The thin film transistor of claim 1, wherein,
the semiconductor layer includes a polysilicon region, the polysilicon region including the first region, the second region, and the channel region.

9. The thin film transistor of claim 1, wherein the concentration C4 is not less than $5\times10^{19}$ atoms/cm$^3$ and not more than $1\times10^{23}$ atoms/cm$^3$.

10. The thin film transistor of claim 8, wherein, when viewed from a normal direction of the substrate, the semiconductor layer further includes an amorphous silicon region located outside the polysilicon region.

11. A thin film transistor comprising:
a substrate;
a gate electrode supported by the substrate;
a gate insulating layer covering the gate electrode;
a semiconductor layer disposed on the gate insulating layer, the semiconductor layer including a first region, a second region, and a channel region that is located between the first region and the second region;
a first contact layer disposed above the first region of the semiconductor layer;
a second contact layer disposed above the second region of the semiconductor layer;
a source electrode disposed on the first contact layer, the source electrode being electrically connected to the first region via the first contact layer; and
a drain electrode disposed on the second contact layer, the drain electrode being electrically connected to the second region via the second contact layer, wherein,
the first contact layer and the second contact layer are each an amorphous silicon layer containing an n type impurity;
the amorphous silicon layer includes
  an upper contact region which is in contact with the source electrode or the drain electrode and in which the concentration of the n type impurity is R1 or more,
  a concentration-modulated region which is located between the upper contact region and the semiconductor layer and in which a concentration profile of the n type impurity varies along a depth direction from the source electrode or the drain electrode toward the semiconductor layer, and
  a lower contact region which is directly in contact with the first region or the second region of the semiconductor layer and in which the concentration of the n type impurity is R4 or more;
the concentration-modulated region includes two or more first gradient regions including a portion where the concentration along the depth direction decreases from R3 to R2 within a range of 20 nm and two or more second gradient regions including a portion where the concentration along the depth direction increases from R2 to R3 within a range of 20 nm, the first gradient regions and the second gradient regions alternating with each other;
the concentrations R1, R2 and R3 satisfy the relationship R2<R3<R1; and
the concentrations R3 and R4 satisfy the relationship R3<R4.

12. The thin film transistor of claim 11, wherein, in the first gradient region, the concentration decreases by two orders of magnitude or more.

13. The thin film transistor of claim 11, wherein the concentration R1 is $4.5\times10^{19}$ atoms/cm$^3$, the concentration R2 is $1.5\times10^{17}$ atoms/cm$^3$, and the concentration R3 is $4.5\times10^{17}$ atoms/cm$^3$.

14. A thin film transistor comprising:
a substrate;
a gate electrode supported by the substrate;
a gate insulating layer covering the gate electrode;
a semiconductor layer disposed on the gate insulating layer, the semiconductor layer including a first region, a second region, and a channel region that is located between the first region and the second region;
a first contact layer disposed above the first region of the semiconductor layer, the first contact layer containing an n type impurity;
a second contact layer disposed above the second region of the semiconductor layer, the second contact layer containing an n type impurity,
a source electrode disposed on the first contact layer, the source electrode being electrically connected to the first region via the first contact layer; and
a drain electrode disposed on the second contact layer, the drain electrode being electrically connected to the second region via the second contact layer, wherein,
the first and second contact layers each have a multilayer structure;
the multilayer structure includes
  a first amorphous silicon layer that is directly in contact with the source electrode or the drain electrode,
  N (where N is an integer equal to or greater than 1) two-layer structures S(n) (where n is an integer not smaller than 1 and not greater than N), each two-layer structure S(n) comprising a second amorphous silicon layer and a third amorphous silicon layer that is directly in contact with an upper face of the second amorphous silicon layer, and
  a fourth amorphous silicon layer that is directly in contact with the first region or the second region of the semiconductor layer;
the relationship $\rho2(n)>\rho3(n)>\rho1$ is satisfied for any given n, where $\rho2(n)$ is an electrical resistivity of the second amorphous silicon layer of each of the two-layer structures S(n); $\rho3(n)$ is an electrical resistivity of the third amorphous silicon layer; and $\rho1$ is an electrical resistivity of the first amorphous silicon layer; and
the relationship $\rho3(n)>\rho4$ is satisfied for any given n, where $\rho4$ is an electrical resistivity of the forth amorphous silicon layer.

15. The thin film transistor of claim 14, wherein the electrical resistivity $\rho1$ is 300 Ω·cm or less, the electrical resistivity $\rho2$ is $1\times10^5$ Ω·cm or more, and the electrical resistivity $\rho3$ is not less than 500 Ω·cm but less than 90000 Ω·cm.

16. The thin film transistor of claim 1, wherein,
the thin film transistor is of an etchstop type;
the thin film transistor further comprises a protective insulating layer covering the channel region of the semiconductor layer, wherein a portion of the protective insulating layer is located between the semiconductor layer and the first contact layer and another portion is located between the semiconductor layer and the second contact layer.

17. The thin film transistor of claim 1, wherein,
the thin film transistor is of a channel-etch type;
the thin film transistor further comprises an upper insulating layer covering the semiconductor layer, the source electrode, and the drain electrode of the thin film transistor; and
the upper insulating layer is directly in contact with the channel region of the semiconductor layer.

18. A display apparatus comprising:
the thin film transistor of claim 1; and
a displaying region including a plurality of pixels, wherein
the thin film transistor is disposed in each of the plurality of pixels.

19. A method of producing the thin film transistor of claim 1, comprising:
step (A) of forming the gate electrode, the gate insulating layer, and the semiconductor layer on the substrate;
step (B) of forming on the semiconductor layer a multilayer film including the N (where N is an integer equal to or greater than 1) two-layer structures S(n) (where n is an integer not smaller than 1 and not greater than N), wherein step (B) comprises:
- step (B1) of forming a forth amorphous silicon film containing an n type impurity at the concentration C4 so as to be in contact with the semiconductor layer,
- step (B2) of, after step (B1), forming the N two-layer structures S(n), wherein each of the two-layer structures S(n) is formed by depositing, in this order, a second amorphous silicon film containing an n type impurity at the concentration C2(n) and a third amorphous silicon film being directly in contact with the upper face of the second amorphous silicon film and containing an n type impurity at the concentration C3(n); and
- step (B3) of, after step (B2), forming a first amorphous silicon film containing an n type impurity at the concentration C1;

step (C) of forming, on the multilayer film, an electrically conductive film so as to be directly in contact with the first amorphous silicon film; and step (D) of patterning the electrically conductive film and the multilayer film to form the source electrode and the drain electrode from the electrically conductive film, and to form the first contact layer and the second contact layer from the multilayer film.

20. A method of producing the thin film transistor of claim 11, comprising:
- step (A) of forming the gate electrode, the gate insulating layer, and the semiconductor layer on the substrate;
- step (B) of forming, on the semiconductor layer, an amorphous silicon film that includes the lower contact region, the concentration-modulated region and the upper contact region by a CVD technique using an impurity-containing gas containing the n type impurity and a material gas, comprising, while changing a ratio of the impurity-containing gas to the material gas, controlling a concentration of the n type impurity along the depth direction to consecutively form the amorphous silicon film;
- step (C) of forming an electrically conductive film on the amorphous silicon film; and
- step (D) of patterning the electrically conductive film and the amorphous silicon film to form the source electrode and the drain electrode from the electrically conductive film, and to form the first contact layer and the second contact layer from the amorphous silicon film.

* * * * *